United States Patent
Meynants

(10) Patent No.: US 9,666,618 B2
(45) Date of Patent: May 30, 2017

(54) PIXEL ARRAY WITH INDIVIDUAL EXPOSURE CONTROL USING AT LEAST TWO TRANSFER GATES FOR A PIXEL OR PIXEL REGION

(75) Inventor: Guy Meynants, Retie (BE)

(73) Assignee: CMOSIS NV, Berchem (Antwerp) (BE)

( * ) Notice: Subject to any disclaimer, the term of this patent is extended or adjusted under 35 U.S.C. 154(b) by 278 days.

(21) Appl. No.: 13/537,832

(22) Filed: Jun. 29, 2012

(65) Prior Publication Data
US 2013/0001404 A1    Jan. 3, 2013

(30) Foreign Application Priority Data
Jun. 30, 2011 (GB) .................................. 1111158

(51) Int. Cl.
H01L 27/146 (2006.01)
H04N 5/353 (2011.01)
H04N 5/3745 (2011.01)
H04N 5/374 (2011.01)

(52) U.S. Cl.
CPC ..... H01L 27/14609 (2013.01); H04N 5/3535 (2013.01); H04N 5/3741 (2013.01); H04N 5/3745 (2013.01)

(58) Field of Classification Search
CPC ......... H04N 5/341; H04N 5/345; H04N 5/369
USPC ................... 250/208.1, 214 R; 348/302–311; 257/290–292
See application file for complete search history.

(56) References Cited

U.S. PATENT DOCUMENTS

| | | | |
|---|---|---|---|
| 5,881,184 A * | 3/1999 | Guidash | 382/321 |
| 6,175,383 B1 * | 1/2001 | Yadid-Pecht et al. | 348/302 |
| 7,045,753 B1 | 5/2006 | Fox | |
| 8,780,241 B2 * | 7/2014 | Johnson | 348/294 |
| 2008/0297615 A1 * | 12/2008 | Kagawa | H04N 3/155 348/222.1 |
| 2009/0134437 A1 | 5/2009 | Nakashima et al. | |
| 2009/0180010 A1 | 7/2009 | Adkisson et al. | |

(Continued)

FOREIGN PATENT DOCUMENTS

| | | |
|---|---|---|
| EP | 2109306 B1 | 3/2015 |
| WO | 2008138543 A1 | 11/2008 |

OTHER PUBLICATIONS

Great Britain Search Report for GB 1111158.0, Oct. 28, 2011.
(Continued)

*Primary Examiner* — Francis M LeGasse, Jr.
(74) *Attorney, Agent, or Firm* — Bacon & Thomas, PLLC

(57) ABSTRACT

A pixel array includes a plurality of pixel structures, with each pixel structure having a photo-sensitive element for generating charge in response to incident light; a charge conversion element; a first transfer gate and a second transfer gate connected in series between the photosensitive element and the charge conversion element or between the photosensitive element and a supply line; and an output stage. A first transfer gate control line is connected to the first transfer gates of a first sub-set of the pixel structures in the array; and a second transfer gate control line connected to the second transfer gates of a second sub-set of the pixel structures in the array. The first sub-set of pixel structures and second sub-set of pixel structures partially overlap, having at least one pixel structure in common between them.

18 Claims, 27 Drawing Sheets

(56) References Cited

U.S. PATENT DOCUMENTS

| | | |
|---|---|---|
| 2009/0225189 A1 | 9/2009 | Morin |
| 2009/0268876 A1* | 10/2009 | Crucs et al. .................. 378/207 |
| 2010/0128156 A1* | 5/2010 | Tanaka et al. ................ 348/308 |
| 2012/0002089 A1* | 1/2012 | Wang ................ H01L 27/14603 348/297 |

OTHER PUBLICATIONS

O. Yadid-Pecht, et al, "CMOS Active Pixel Sensor Star Tracker with Regional Electronic Shutter", IEEE Journal of Solid State Circuits, vol. 32, No. 2, Feb. 1997, pp. 285-288.

* cited by examiner

PIXEL ARRAY WITH INDIVIDUAL EXPOSURE CONTROL USING AT LEAST TWO TRANSFER GATES FOR A PIXEL OR PIXEL REGION

FIELD OF THE INVENTION

This invention relates to pixel structures and to arrays of pixel structures which can be used in applications such as image sensors.

BACKGROUND TO THE INVENTION

Image sensors can be designed with an array of active pixels using a semiconductor process such as CMOS. A known type of active pixel is a four transistor (4T) pixel. This type of pixel is shown in FIG. 1, and comprises a photo-sensitive element such as a photodiode PD, a buffer amplifier (source follower) sf, a reset switch res with a control line RES and a select switch sel with a control line SEL. The pixel comprises a charge conversion element, also called a floating diffusion fd. A transfer gate tr connects between the photo-sensitive element PD and the charge conversion element fd. Exposure time in a four transistor (4T) global shutter pixel is controlled by the transfer line. Before the start of the exposure period, the transfer line is pulsed when the floating diffusion is kept in its reset state. Typically, the transfer line is a horizontal line of the pixel array connected to a row of pixels in the array. This means that the exposure time will start at the same moment for all pixels connected to that same transfer line.

It is desirable, in some applications, to have a different exposure time for different regions of the image. An example application in the automotive field is described in US 2009/0225189A1 and an example of a star tracker used for navigation of spacecrafts is described in O. Yadid-Pecht, et al, "CMOS Active Pixel Sensor Star Tracker with Regional Electronic Shutter", IEEE Journal of Solid State Circuits, vol. 32, No. 2, February 1997, pp. 285-288.

The O. Yadid-Pecht reference describes a technique to control the exposure time individually per pixel. This is applied to classical three-transistor (3T) active pixels. A series switch is connected between the reset control line and the gate of the reset transistor.

SUMMARY OF THE INVENTION

The present invention seeks to provide an alternative way of controlling exposure time of a pixel structure and also such a pixel structure with means for controlling exposure time.

An aspect of the invention provides a pixel array comprising a plurality of pixel structures. Each pixel structure comprises a photo-sensitive element for generating charge in response to incident light; a charge conversion element; a first transfer gate and a second transfer gate connected in series between the photosensitive element and the charge conversion element or between the photosensitive element and a supply line; and an output stage. A first transfer gate control line is connected to the first transfer gates of a first sub-set of the pixel structures in the array; and a second transfer gate control line connected to the second transfer gates of a second sub-set of the pixel structures in the array. The first sub-set of pixel structures and second sub-set of pixel structures partially overlap, having at least one pixel structure in common between them.

In another aspect an array of pixel structures is provided, each pixel structure comprising a photo-sensitive element for generating charge in response to incident light, a charge conversion element, a first transfer gate and a second transfer gate connected in series between the photosensitive element and the charge conversion element or between the photosensitive element and a supply line and an output stage, the array comprising:

means for operating such as a control logic first gates of a first sub-set of the pixel structures in the array; and means for operating such as a second logic second gates of a second sub-set of the pixel structures in the array for a period which at least partially overlaps operation of the first transfer gate control line, wherein the first sub-set of pixel structures and second sub-set of pixel structures partially overlap, having at least one pixel structure in common between them.

Any of the pixel arrays described above can be combined with the features of any of claims 2 to 15.

An advantage of the pixel array is that pixel structures in the array can have different exposure periods.

A pixel structure can be reset when both transfer gate control lines, and hence both the first and second transfer gates, are operated at the same time as operating a reset stage. This defines the start of the exposure period. Preferably a reset control line connects to the reset stage, e.g. in one of a first sub-set of pixel structures and a second sub-set of pixel structures.

As the transfer gate control lines connect to different sub-sets of pixel structures, pixel structures in the different sub-sets can be controlled differently.

The exposure period can be individually controlled for a sub-set (e.g. region) of pixels or individually for each pixel, if required, by appropriate configuration of the transfer gate control lines and control logic which drives the transfer gate control lines.

Advantageously, the first sub-set of pixel structures and the second sub-set of pixel structures have only one pixel structure in common between them. This allows individual control of the exposure period of each pixel.

Advantageously, the first sub-set of pixel structures and the second sub-set of pixel structures are arranged perpendicularly in the array. The first sub-set of pixel structures can be one of a row and a column of the array and the second sub-set of pixel structures can be the other of a row and a column of the array. One transfer gate control line is directed along a row of the array and the other transfer gate control line is directed along the column of the array.

In at least one embodiment, the first and second transfer gates are connected in series between the photo-sensitive element and the charge sensing node. A pixel structure can be reset when both transfer gate control lines, and hence both the first and second transfer gates, are operated at the same time as the charge sensing node is held in reset. This defines the start of the exposure period. Charges are transferred from the photo-sensitive element to the charge sensing node when both transfer gate control lines, and hence both transfer gates, are operated. This defines the end of the exposure period. Preferably, the charge sensing node is not held in reset.

In at least one embodiment, the first and second transfer gates are connected in series between the photo-sensitive element and a supply line. When both of the first and second transfer gates are operated, the pixel structure is reset. This defines the start of the exposure period of the pixel. An additional transfer gate can be provided in the conventional position between the photo-sensitive element and the charge sensing node.

The pixel array comprises a plurality of first transfer gate control lines, each connected to a respective first sub-set of pixel structures and a plurality of second transfer gate control lines, each connected to a respective second sub-set of pixel structures.

Advantageously, the output stage of each pixel structure comprises a select switch. One of the transfer gate control lines can be connected to the select switches in the same sub-set of pixel structures as the transfer gate control line. This has an advantage that the overall number of control lines in the array is not increased.

Advantageously, the second transfer gate is connected to the charge conversion element. The pixel array further comprises control logic arranged to control read-out of one of the pixel structures in a mode where charges transferred from the photo-sensitive element are stored on a combination of the second transfer gate and the charge conversion element. This provides a high capacity, low conversion gain, mode of operation.

Advantageously, the voltage on the second transfer gate is higher than on the first transfer gate. This facilitates charge transfer from the photodiode to the floating diffusion, and avoids that charge floats back to the photodiode at the moment when the gates are closed.

Embodiments of the present invention provide a method of controlling an exposure period of a first pixel structure in an array of pixel structures, each pixel structure comprising a photo-sensitive element for generating charge in response to incident light, a charge conversion element, a first transfer gate and a second transfer gate connected in series between the photosensitive element and the charge conversion element or between the photosensitive element and a supply line and an output stage. The method may comprise:

operating a first transfer gate control line connected to the first gates of a first sub-set of the pixel structures in the array; and operating a second transfer gate control line connected to the second gates of a second sub-set of the pixel structures in the array for a period which at least partially overlaps operation of the first transfer gate control line, wherein the first sub-set of pixel structures and second sub-set of pixel structures partially overlap, having at least the first pixel structure in common between them.

In any of the embodiments, the pixel structures can be semiconductor pixel structures formed by a process such as CMOS.

BRIEF DESCRIPTION OF THE DRAWINGS

Embodiments of the invention will be described, by way of example only, with reference to the accompanying drawings in which.

DESCRIPTION OF PREFERRED EMBODIMENTS

Figure 1:
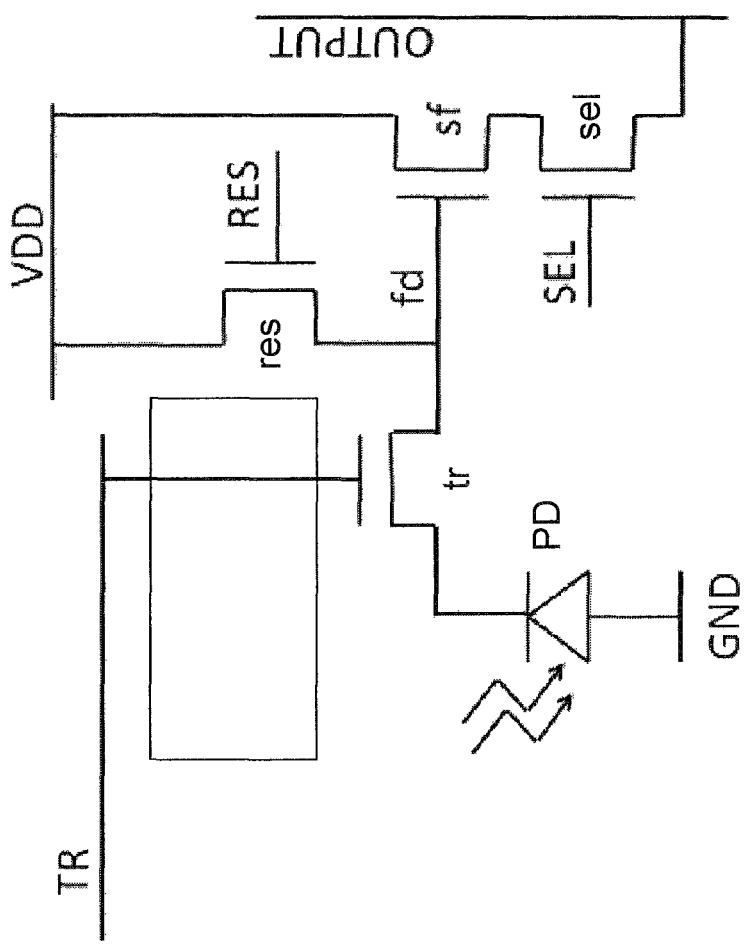
FIG. 1 shows a four transistor (4T) active pixel.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Figure 2:
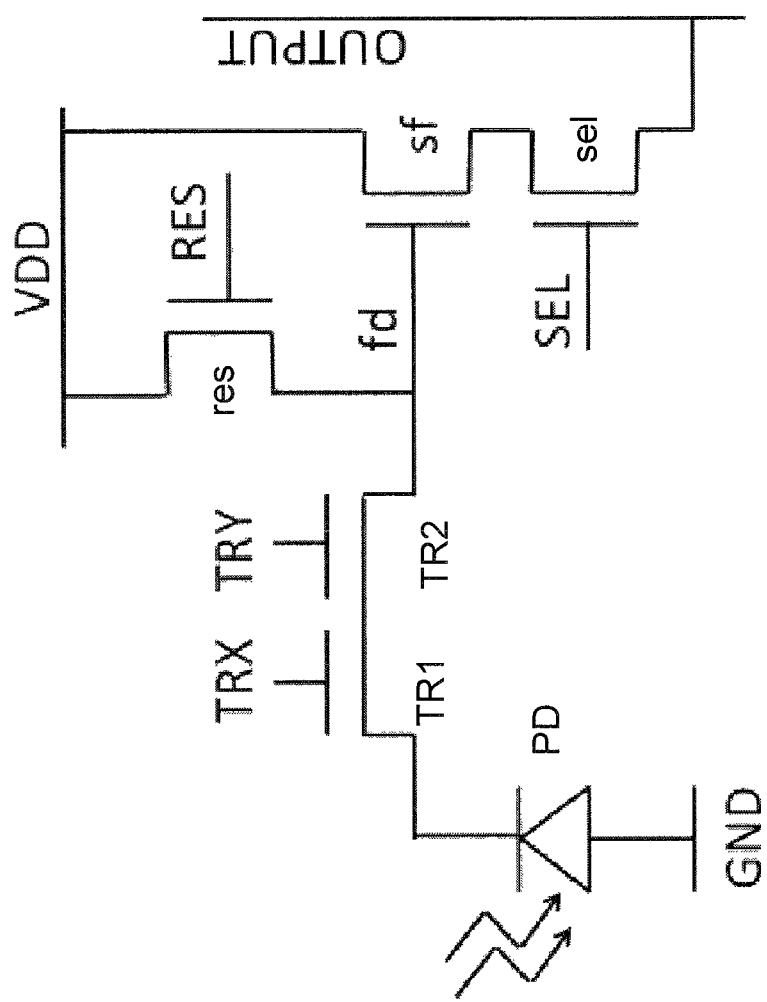
FIG. 2 shows a pixel structure according to an embodiment of the present invention with two transfer gates connected in series.

FIG. 2 shows a pixel structure according to an embodiment of the present invention. This pixel structure is a modified 4T (four transistor) pixel comprising a photo-sensitive element PD such as a pinned photodiode, a reset switch res with a control line RES, a buffer amplifier (source follower) sf and a select switch sel with a control line SEL. The pixel comprises a charge conversion element, also called a floating diffusion fd. Two transfer gates TRX, TRY are connected in series between the photo-sensitive element PD and the charge conversion element fd. The first transfer gate TR1 is connected on one side to the photodiode PD and on the other side to the second transfer gate TR2. The second transfer gate TR2 is adjacent to the first transfer gate TR1 and to the charge conversion node fd. An output stage of the pixel comprises the buffer amplifier sf and select switch sel. Each of the transfer gates TR1, TR2 is connected to a control line TRX, TRY which controls operation of the gate. Control lines TRX, TRY are connected to a plurality of pixels in the array. In an advantageous embodiment, control line TRX connects to transfer gates TR1 in a row of pixels of the array and control line TRY connects to transfer gates TR2 in a column of pixels of the array. Each individual pixel in the array can be individually controlled by a combination of the TRX and TRY control lines. There is a control line TRX for each row of pixels of the array and a control line TRY for each column of pixels in the array. Control logic controls operation of the control lines TRX, TRY and other lines RES, SEL of the array. Logic can control an individual pixel of interest or can control multiple pixels (or regions of the array) of interest. This allows to reset photodiodes only on specific pixels or specific regions on the pixel array, and control the exposure time for each pixel or each region separately. In addition it is possible to control the end time of an exposure of a pixel by operating TR1 and TR2 at selected times, by using the transfer gates TR1 and TR2 gates in between the photodiode PD and the floating diffusion fd. However, the latter operation is not available with two series-connected gates which connect to the supply line.

Figure 3:
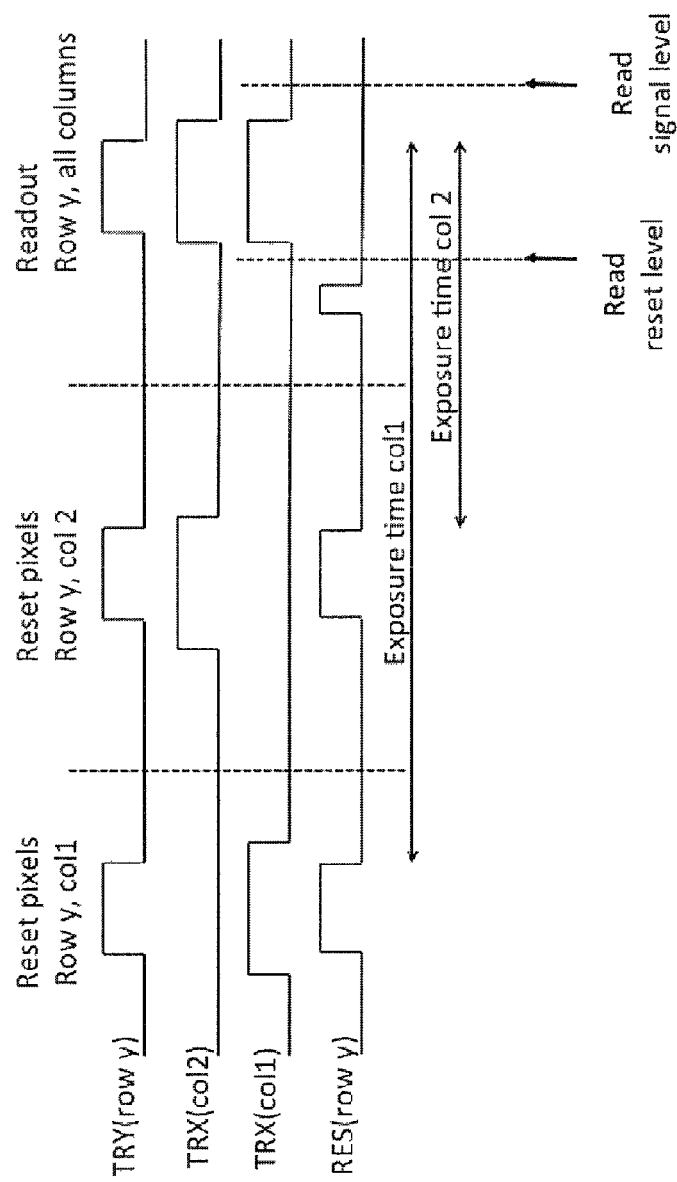
FIG. 3 shows a timing diagram illustrating operation of the pixel structure of FIG. 2.

FIG. 3 shows a timing diagram for operating pixels of the type shown in FIG. 2. At the start of the exposure time of a particular pixel the photodiode is fully depleted by turning on TR1 (via control line TRX) and TR2 (via control line TRY) at the same time as turning on the reset switch res. This also causes the floating diffusion fd to be reset. This operation can be controlled individually, per pixel. FIG. 3 shows how several different pixels in the array are controlled. A first pixel (row y, col1) is controlled so as to reset the pixel and begin the exposure period. Subsequently, a second pixel (row y, col2) of the array is controlled so as to reset the pixel and begin the exposure period. In practice, the vertical transfer gate control line TRX is put high on the pixel of a row that needs to be reset. Then the horizontal transfer line TRY is pulsed together with the reset line RES to deplete the photodiode and start the exposure period for the selected pixels. This can be done at different moments in time for different pixels of the same row.

Readout will now be described. The floating diffusion fd is reset first by a pulse on the RES line. The reset level is sampled in a column amplifier of the array. Then, charge is transferred to the floating diffusion for the pixels where both transfer gate control lines are pulsed high. All pixels in a particular row can be read at the same time, each via a respective column output line, as shown in FIG. 3. Pixel (row y, col1) has a longer exposure time than pixel (row y, col2). Alternatively, pixels in different columns of a particular row can be read at different times, if required. It is also possible to read out different columns at different moments in time, and realize a high-speed region of interest (ROI) readout of a window with short exposure time and meanwhile perform a low-speed readout of a window with a longer exposure time.

Figure 4:
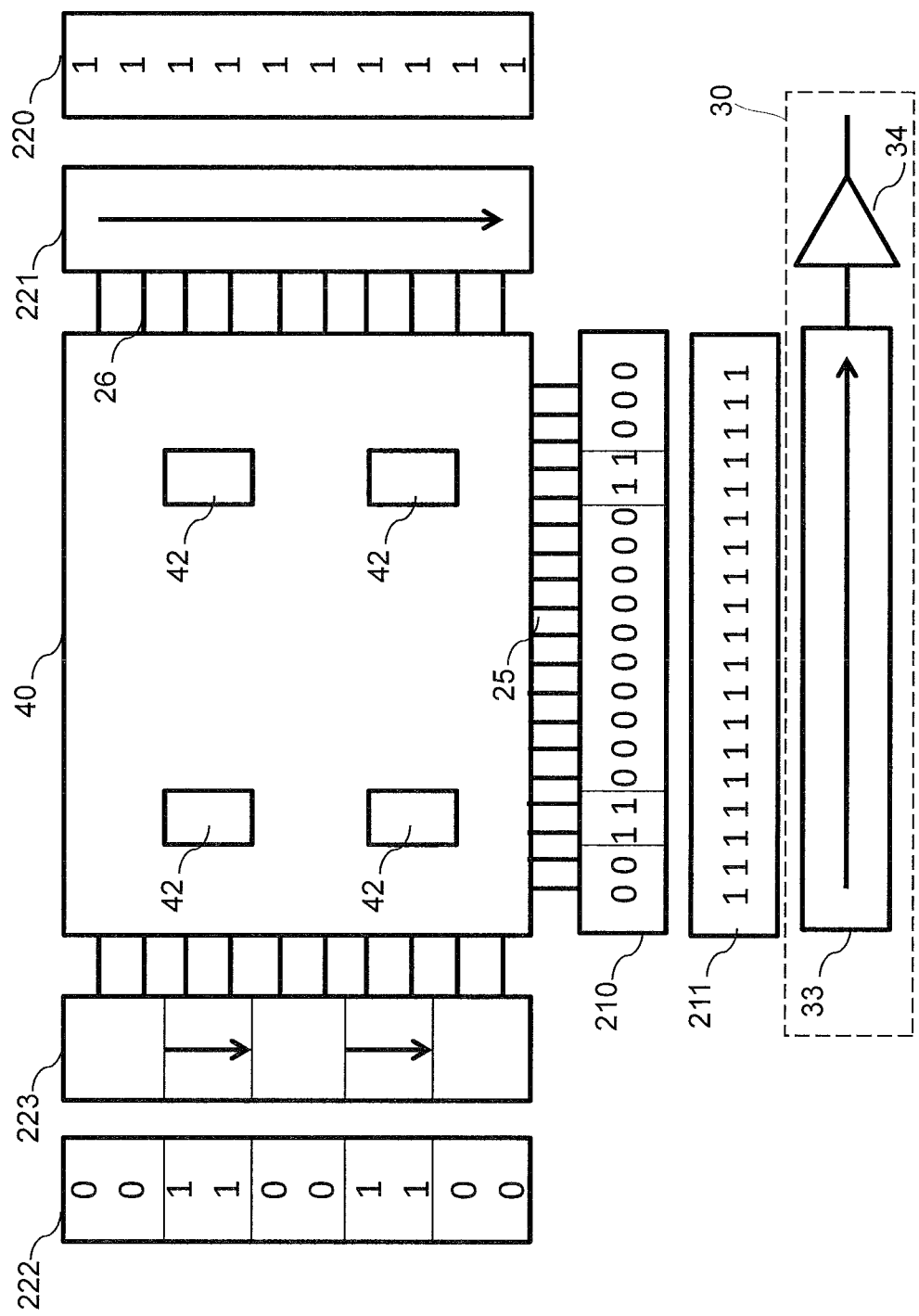
FIG. 4 shows the architecture of an image sensor according to an embodiment of the present invention with pixels of the type as shown in FIG. 2.

FIG. 4 shows an architecture of an image sensor, whereby the image sensor contains a pixel array 40 which is read out at a regular frame rate (for example, 30 frames per second). The pixels can be of the type as shown in FIG. 2 or another pixel type described in this application. In an embodiment of the invention illustrated in FIG. 4, four regions of interest 42 can be read out at a much higher frame rate (for example 300 or 3000 times per second). This can, for example, be used to measure the average exposure signal during the exposure of the regular pixels in the array. This readout can be destructive, thereby destroying the charge that has been integrated in the pixels. This will be the case with pinned photodiode pixels. During each readout, the pixels in the region of interest 42 are reset. To read out the pixels, advantageously two row control logic circuits are provided, one 222, 223 at the left side and one 220, 221 at the right side of the pixel array. The row control logic circuits control which rows are read out and/or reset during read out of a frame. The row logic at the right side of the pixel array can be composed of a row address register 220 and a shift register 221. The row address register 220 indicates which rows are read out for the full resolution, low speed, readout. If a logic '1' is written in the register of a row, this row is read out. If a logic '0' is written, the shift register 221 will skip that row. For a full resolution image readout, a logic '1' is written for every row in the entire register 220. The shift register 221 will then advantageously scan through the entire pixel array. The shift register 221 drives horizontal control signals in the pixel array 40 via control lines 26. This can include signals to reset the row of pixels and one of the two transfer gate signals TR1. The other transfer gate signal TR2 can be driven by control lines 25. These are advantageously driven vertically from a column address register 210 or 211. These column address registers control which columns are read out (and/or reset) when the frame is read out (and/or reset). Column address register 211 can be used for full resolution readout in the example. When TR1 is driven via register 220, then TR2 is driven via register 211. For fast frame readout, the horizontal control lines 26 are driven from the row address register 222 and the shift register 223. In this example, only four rows have a logic '1' in their left row address register 222. Only these four rows will be read out in the fast frame cycle. Column address register 210 can be used in conjunction with row shift register and row logic 223 and row address register 222. The column address register 210 controls which columns are read out and reset during the fast readout cycle. In this example, only 4 columns can contain a logic '1' in their column register. Only these 4 columns are used in readout of the fast frame. This results in four regions of interest 42, each containing 2×2 pixels, which are read out. Since this is only 16 pixels, this readout can happen very quickly. During readout the pixels can also be reset. The exposure time for these 16 pixels can then also be very short. The exposure time for the other pixels of the pixel array 40 can be much longer. During readout of the entire frame the pixels in regions of interest 42 can also be read out again. They will have a much smaller signal in that case. FIG. 4 further shows output circuitry 30 comprising a multiplexer 33 and an output amplifier 34 which can be used to multiplex and read out the signals on the column output lines of the pixels. Multiplexer 33 can be composed of a column amplifier, a shift register and an analog multiplexer to an output bus. The shift register in multiplexer 33 will advantageously only address the columns which have a logic 'one' in the column address registers 210 or 211. It is also possible to replace the analog multiplexer by a column AD converter and a digital multiplexer.

When multiple pixels are read out at the same time, the transfer pulses do not need to be exactly equal in shape. Instead, the transfer pulses only need to overlap for part of the time. For readout, keeping TR2 on (high) has an advantage of increasing the capacitance of the floating diffusion fd. This is useful for readout of a large charge packet.

It is possible to keep TR1 on (high) during the exposure time. This increases the PD capacity but has a drawback that the dark current will be considerably higher. This is because the transfer gate is typically a surface channel device and the charge packet in the photodiode will not be shielded from the surface.

Advantageously, once TR1 is turned on (high), it should not be turned off again until TR2 has been turned on. This prevents charge moving back to the photodiode.

If the addressing logic and readout logic for TRX and TRY supports it, more than two exposure times could be implemented for different pixels in the array.

Figure 5:
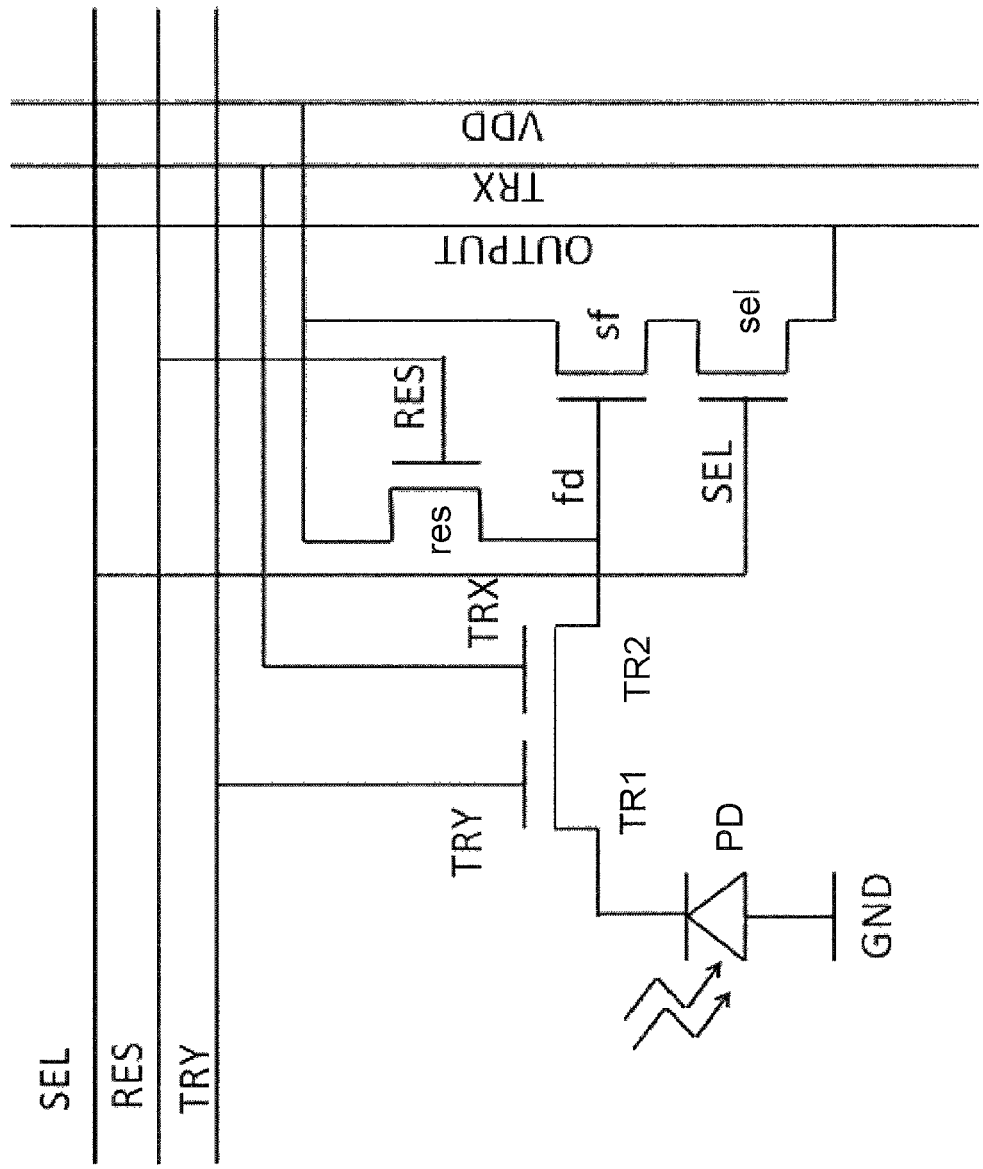
FIG. 5 shows routing of control, supply and output lines of the pixel of FIG. 2.

FIG. 5 shows a possible routing of the transfer gate control lines TRX, TRY, along with select control line SEL, reset control line RES, output line OUTPUT and power supply VDD.

Figure 6:
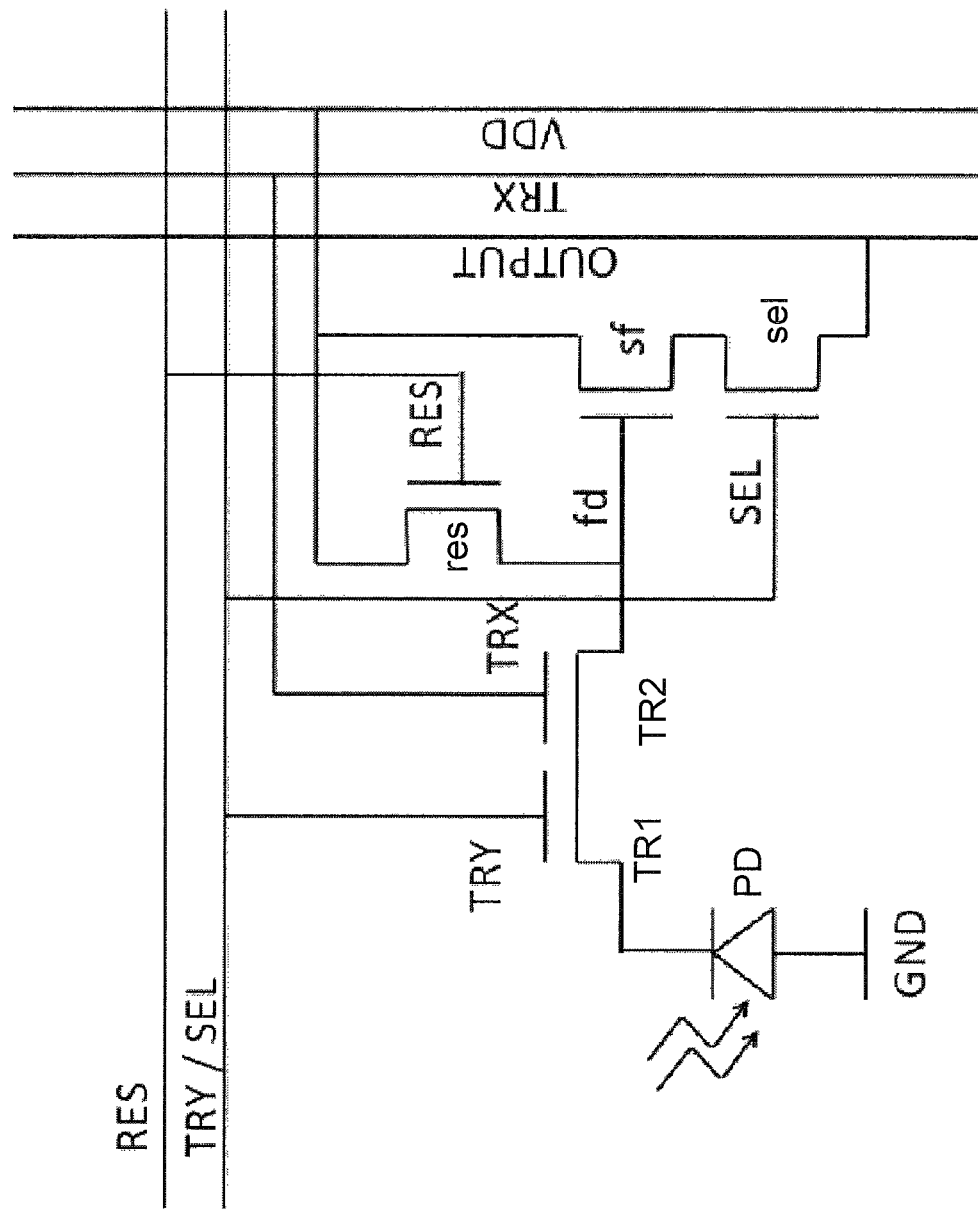
FIGS. 6 and 7 show alternative routings for the control, supply and output lines, with the select control line shared with one of the transfer gate control lines.
Figure 7:
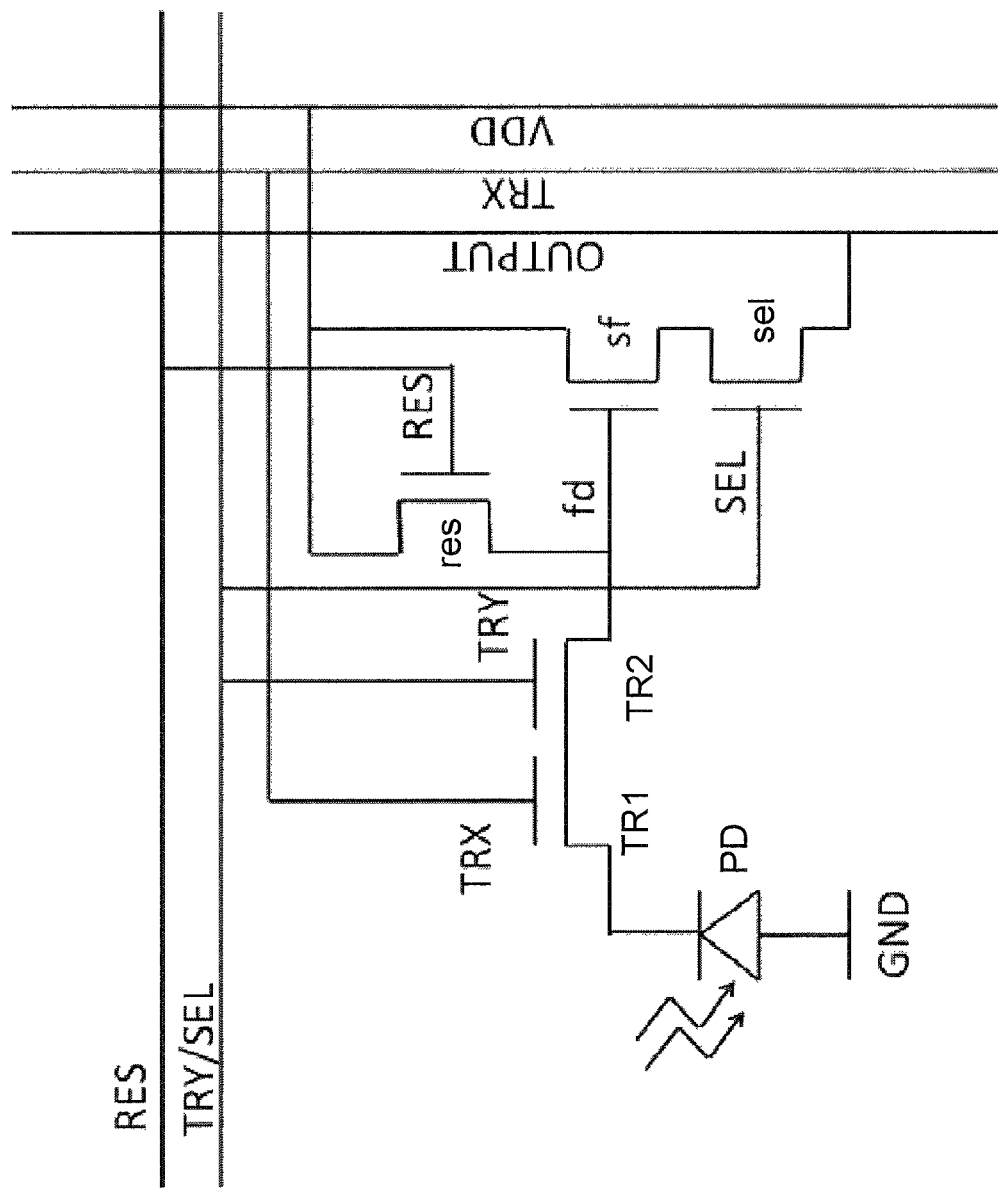

FIGS. 6 and 7 show two alternative configurations where one of the two transfer gate control lines TRX/TRY is shared with the select line SEL. This has an advantage of reducing the number of control lines requiring routing across the pixel array.

FIG. 6 shows a control line TRY/SEL which is connected to the first transfer gate TR1, adjacent to the pinned photodiode PD, and the select switch SEL. This arrangement provides the charge conversion node fd with the lowest possible capacitance and the highest possible conversion factor, which is advantageous for low noise readout.

FIG. 7 shows a control line TRY/SEL which is connected to the second transfer gate TR2 and the select switch. Here, the capacitance of the charge conversion node fd will be larger during readout (when SEL is enabled). This will be advantageous in cases when a large charge packet must be read out.

Figure 8:
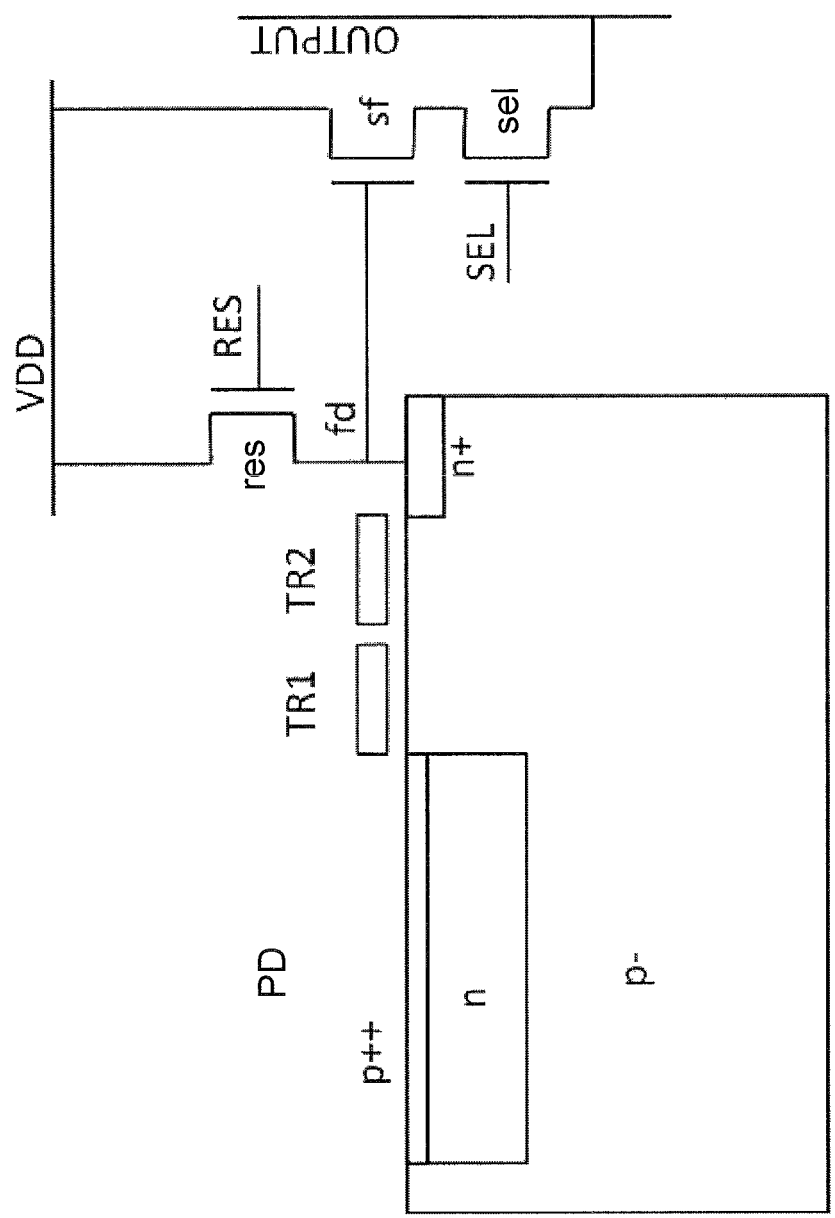
FIG. 8 shows a cross-section of the pixel structure of FIG. 2.

FIG. 8 shows a cross-section of the semiconductor layers which form the photodiode PD, the transfer gates TR1, TR2 and the charge sense node fd.

Figure 9:
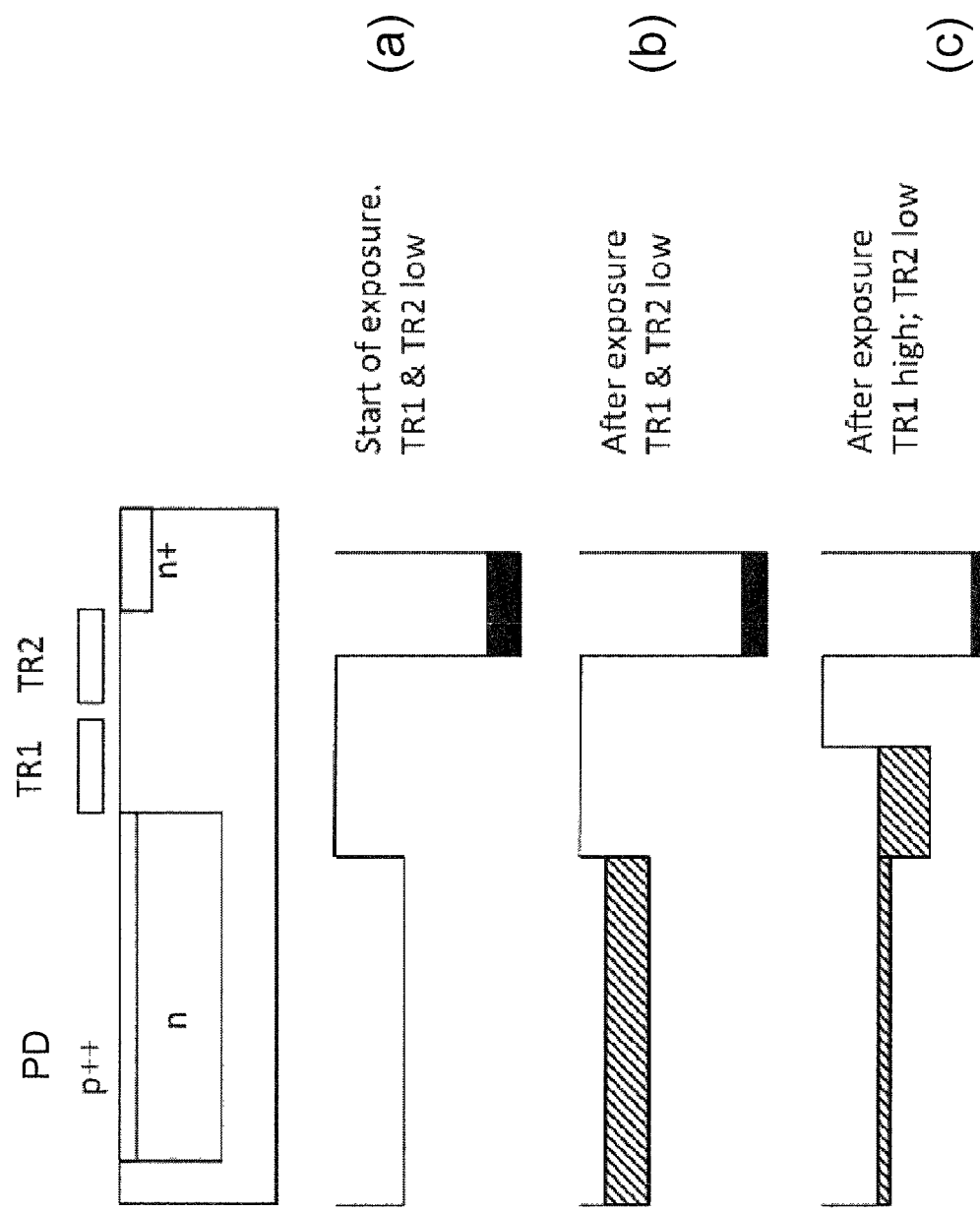
FIGS. 9 and 10 show potential diagrams during operation of the pixel structure of FIG. 2.
Figure 10:
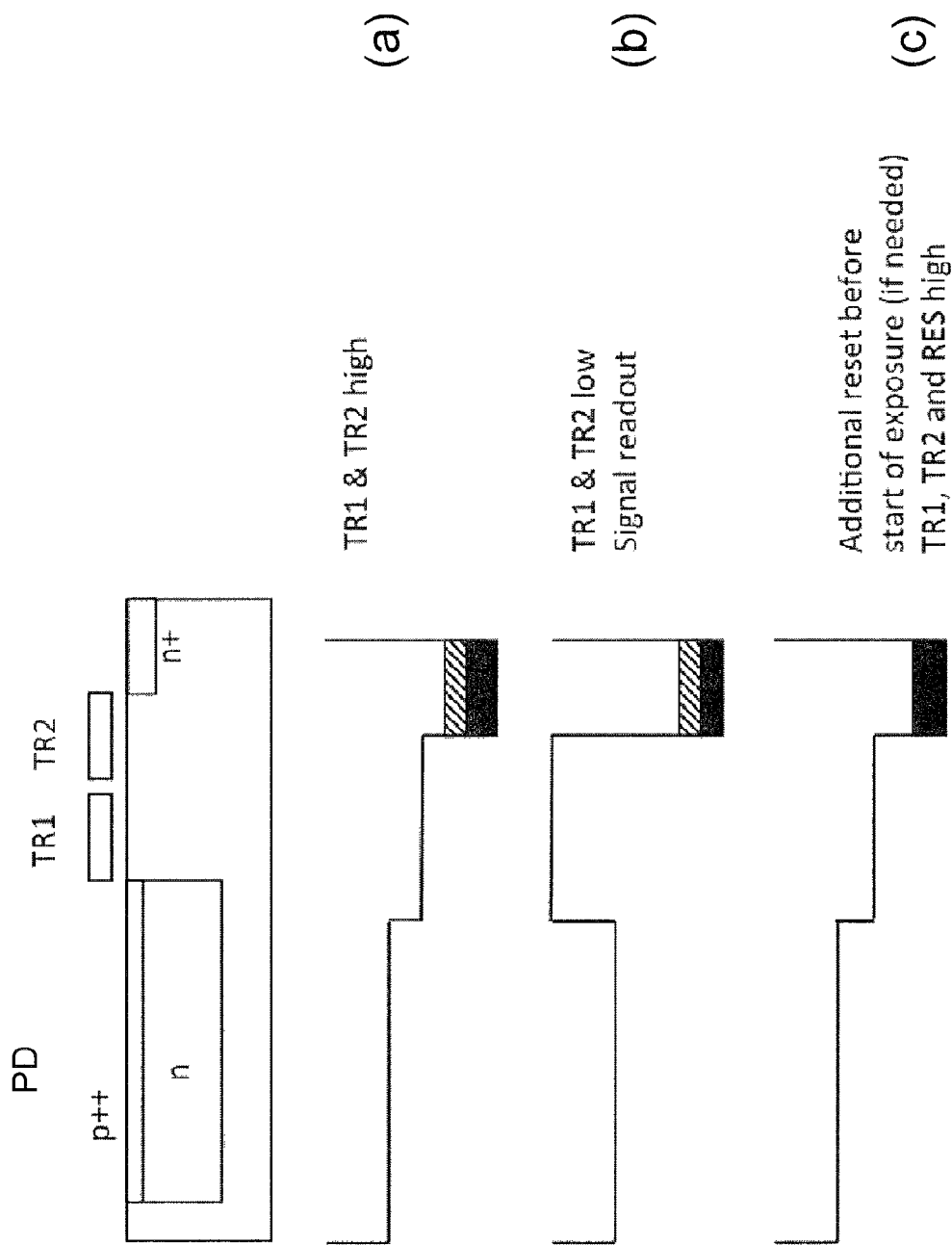
Figure 11:
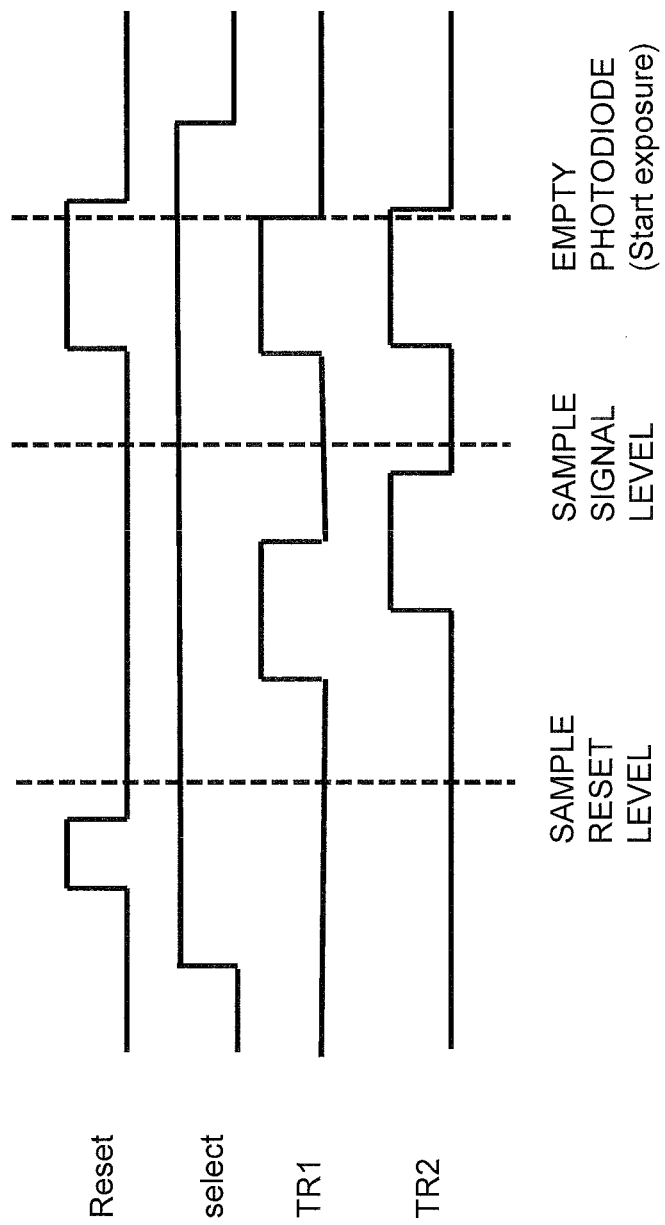
FIG. 11 shows a timing diagram for operating the pixel structure of FIG. 2.

FIGS. 9 and 10 show potential diagrams during a first (standard) mode of operation of the pixel of FIG. 8. FIG. 11 shows the timing of the pixel in the standard mode of operation. FIG. 9(a) shows the start of an exposure period. Transfer gates TR1 and TR2 are off (low potential). During an exposure period, charge accumulates at the photodiode PD. The amount of accumulated charge is proportional to the intensity of light incident on the pixel.

FIG. 9(b) shows the end of the exposure period with TR1 and TR2 still off (low potential). A quantity of charges have accumulated at the photodiode PD. The reset level of the floating diffusion can be read out. This is the reference level of the pixel.

Transfer gate TR1 is now switched on (high potential). FIG. 9(c) shows the end of the exposure period with TR1 on and TR2 off. Charge has at least partially transferred from the photodiode PD to TR1.

Both transfer gates TR1, TR2 are switched on (high potential). FIG. 10(a) shows TR1 and TR2 on. Charge has transferred to the charge conversion node fd.

FIG. 10(b) shows signal read-out. Transfer gates TR1 and TR2 are off (low potential) to prevent any further charge transfer to the charge conversion node.

An additional reset can be performed (if needed) before the start of the next exposure period. This is shown in FIG. 10(c). TR1, TR2 and RES are switched on (high potential). The additional reset may be required to drain away excess charges on the photodiode. It can also be used to define the start of the next exposure period.

Figure 12:
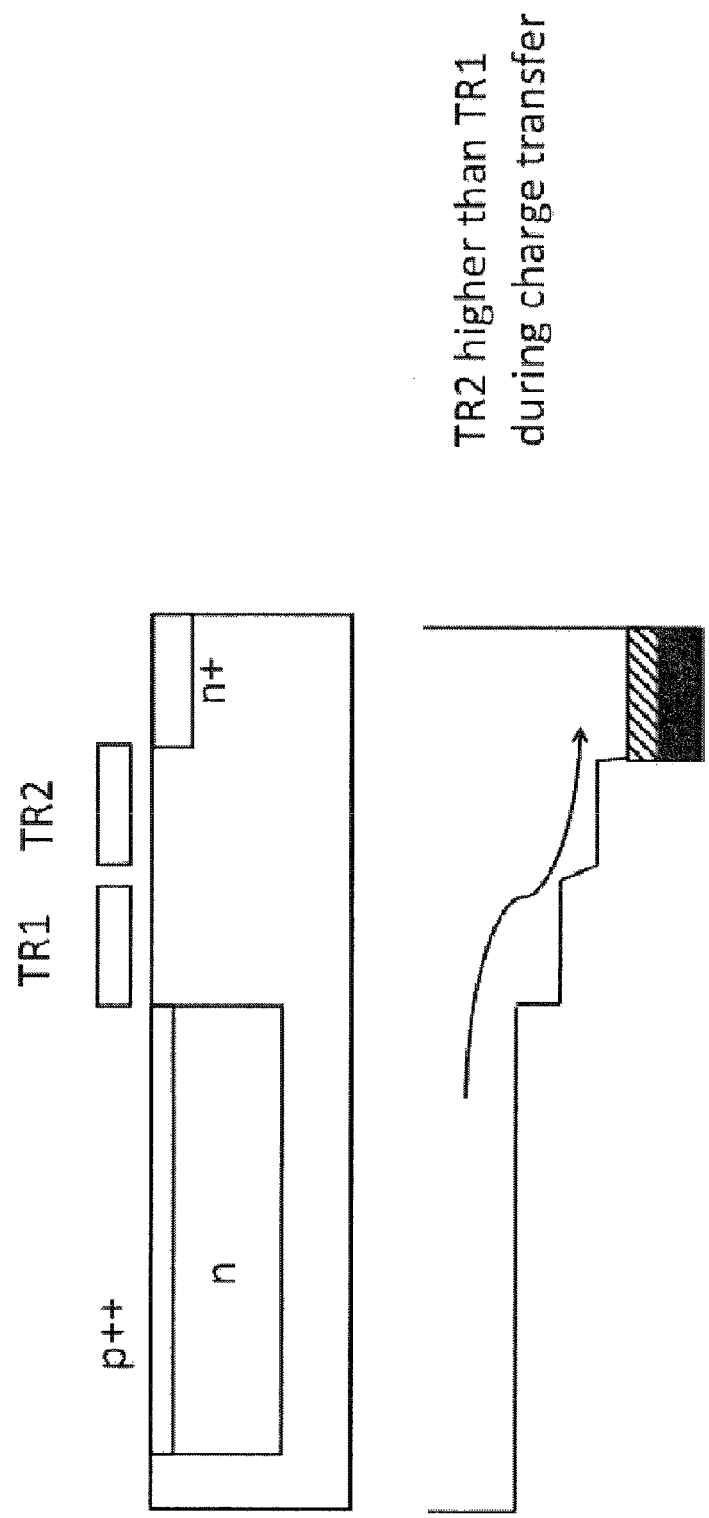
FIG. 12 shows operation of the transfer gates to improve charge transfer.

Advantageously, for a better charge transfer, the high level on the second transfer gate TR2 is higher than on the first transfer gate TR1. This will make it easier for the charge to move to the floating diffusion fd, due to the lateral electric field. This is shown in FIG. 12.

Modulation of the Capacitance of the Charge Conversion Node

Figure 13:
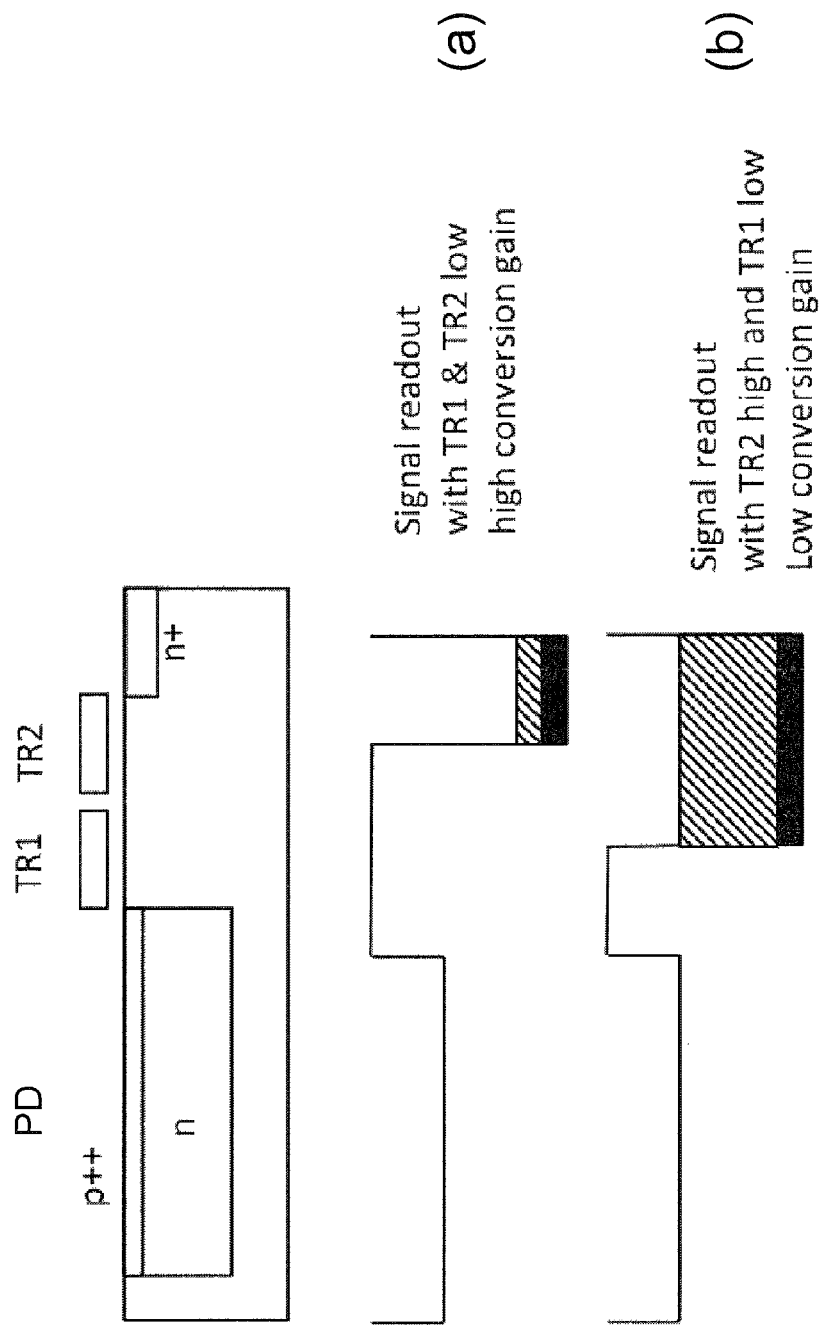
FIG. 13 shows two possible read-out modes for the pixel structure of FIG. 5.

FIG. 13 shows a further advantageous feature. The transfer gate TR2 adjacent to the charge conversion node fd can be operated so as to modulate the capacitance of the charge conversion node fd. This provides a pixel with two conversion gain settings in standard 4T mode:

a low gain (high capacitance) mode when the transfer gate TR2 is switched on (high potential); and a high gain (low capacitance) mode when the transfer gate TR2 is switched off (low potential).

Figure 14:
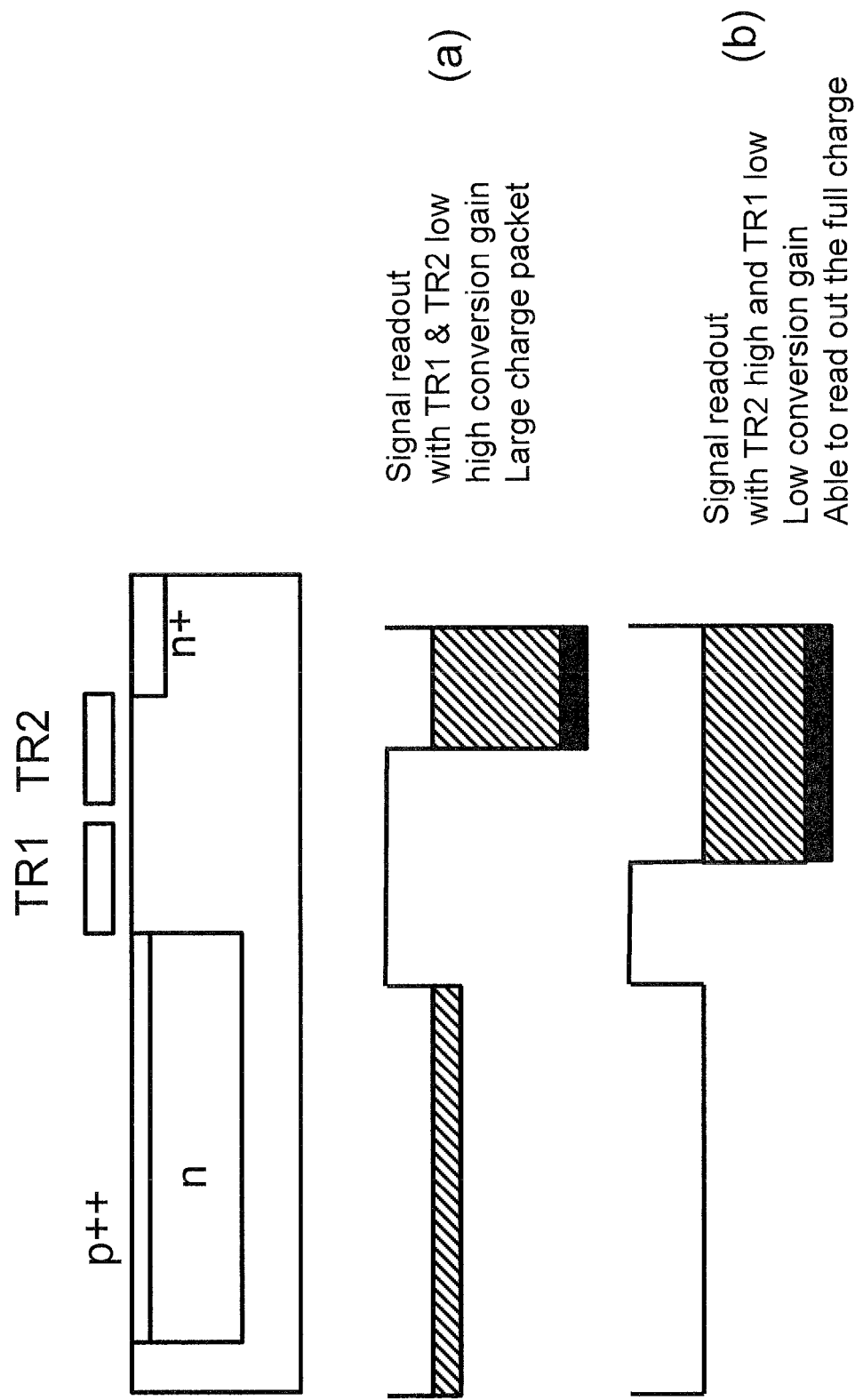
FIG. 14 shows use of a low conversion gain read-out mode to read a large charge packet.

FIG. 13(a) shows the high gain mode. This is useful in low light situations. FIG. 13(b) shows the low gain mode. This is optimised for the full well charge of the photodiode. A larger charge packet can be read out. FIG. 14 illustrates this. In FIG. 14, a large charge packet cannot be accommodated on the sense node when TR1 and TR2 are switched off. However, the same large charge packet can be accommodated on the sense node when TR2 is switched on.

Figure 15:
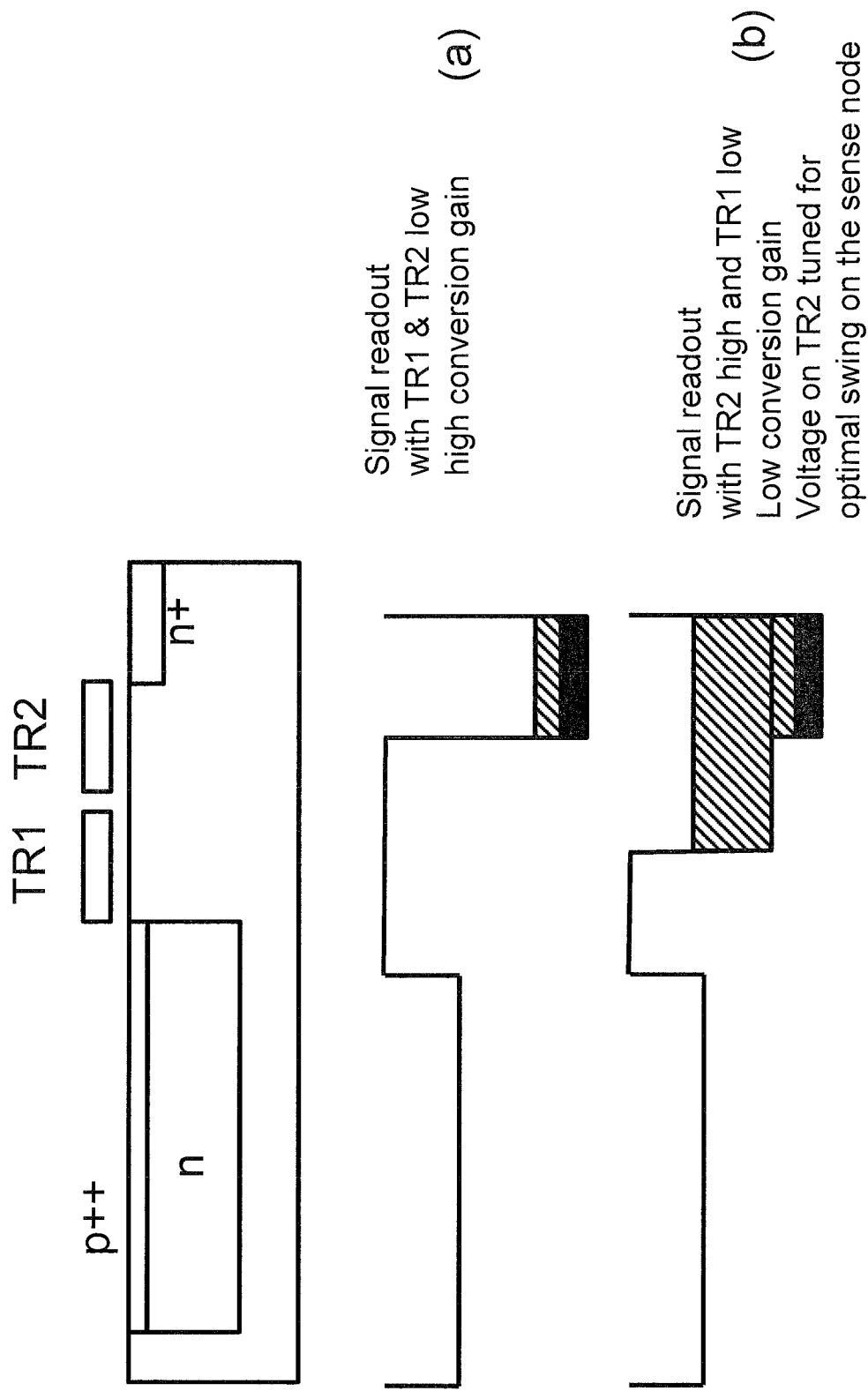
FIG. 15 shows variable control of transfer gate potential.

The gain of the low gain mode is determined by the size of the transfer gate. The TR2 gate size can be selected to store a required amount of charge. It is also possible to change the voltage bias on TR2 to change the relative 'depth' of the charge packet. This is shown in FIG. 15.

Any of the above can be combined with a variable exposure time for the pixels. It is possible to take two readings of the pixel: one reading with low gain mode and one with high gain mode.

Figure 16:
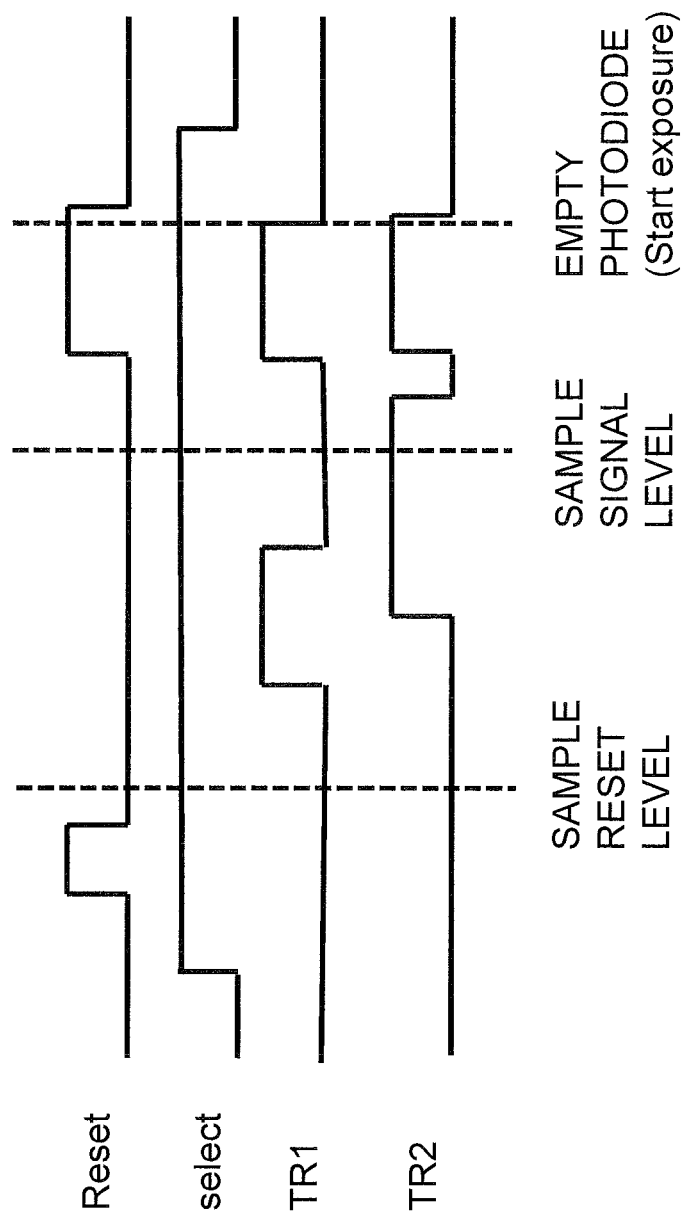
FIGS. 16 to 18 shows timing diagrams for performing read out from the pixel structure.
Figure 17:
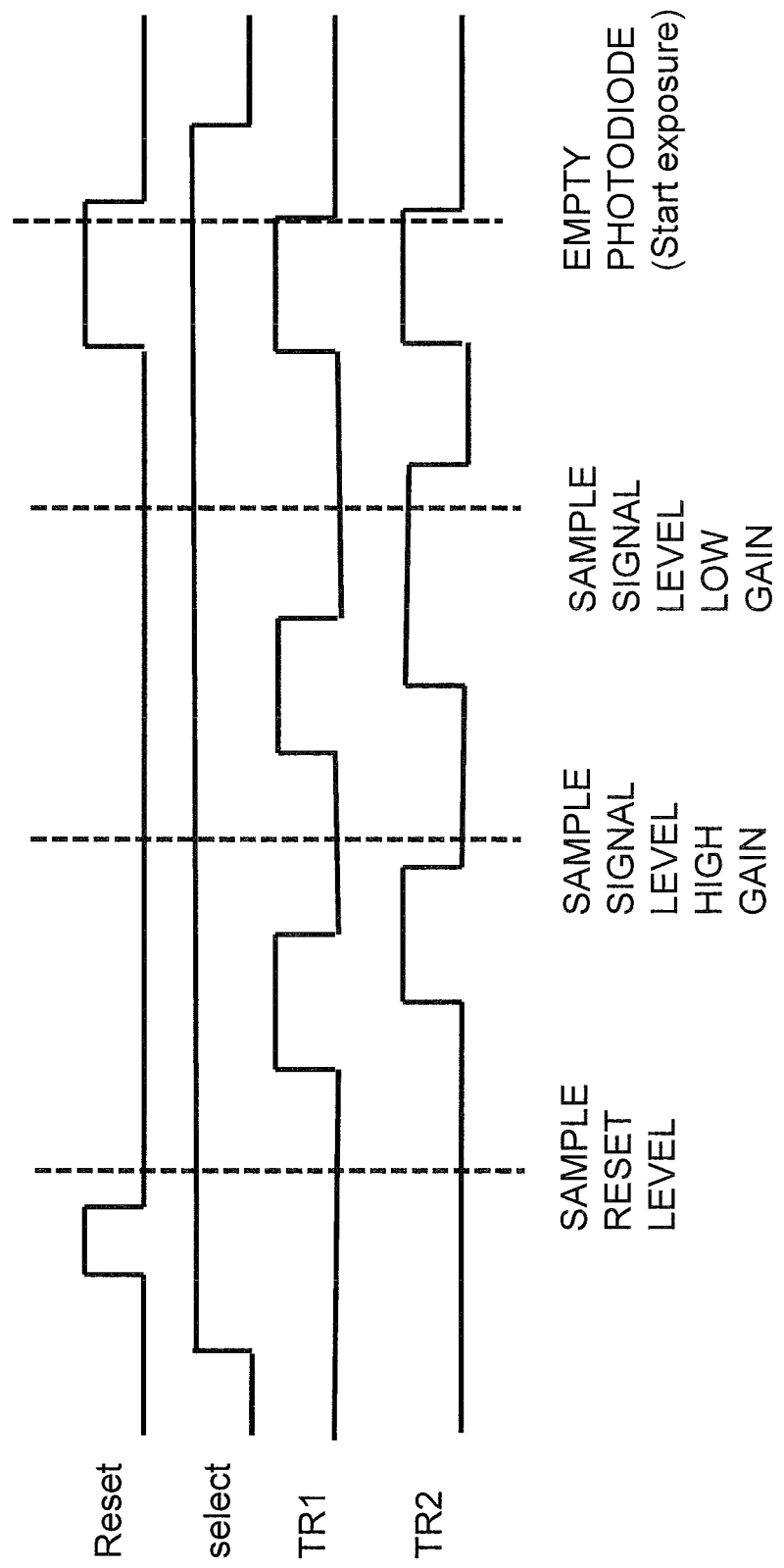
Figure 18:
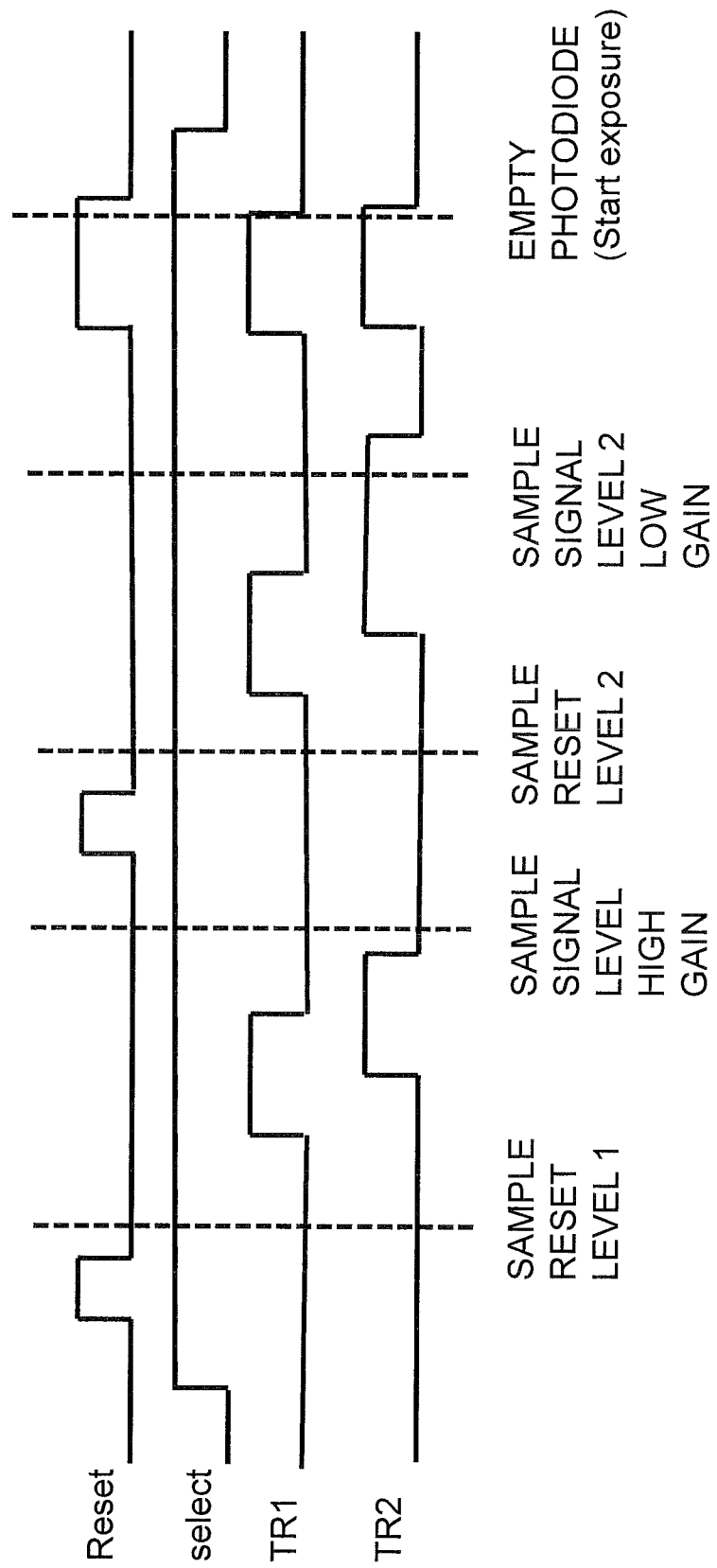

FIGS. 16 to 18 show possible readout schemes. FIG. 17 shows a timing diagram of a two-sample case. The floating diffusion is first reset, and this reset level is read. Then, charge is transferred via TR1 and TR2 to the floating diffusion and TR1 and TR2 are both switched off again. The signal on the floating diffusion is then read. The TR1 and TR2 gates are then pulsed high again to perform a second charge transfer. Any remaining charge of the photodiode will move to the floating diffusion and the TR2 gate. TR1 is then operated again, and the signal is then sampled with a low conversion gain, determined by the capacitance of the TR2 gate and the floating diffusion. Both samples can be referred to the reset level of the floating diffusion before the first charge transfer. Correlated double sampling can be applied to both sample levels by subtracting this reset level from the given sample levels. This eliminates the reset (kTC) noise from the samples.

Optionally, there can be an additional reset pulse between the first and second charge transfer period. In that case, the intermediate reset level must be read out to perform correlated double sampling on the second sample (with low conversion gain). This is shown in FIG. 18.

The pixel can also be operated in low gain mode alone. Timing for this mode is shown in FIG. 16.

Combination with a Global Shutter

The pixel can also be combined with a global shutter. Some possible approaches are shown in FIGS. 19 to 23.

Figure 19:
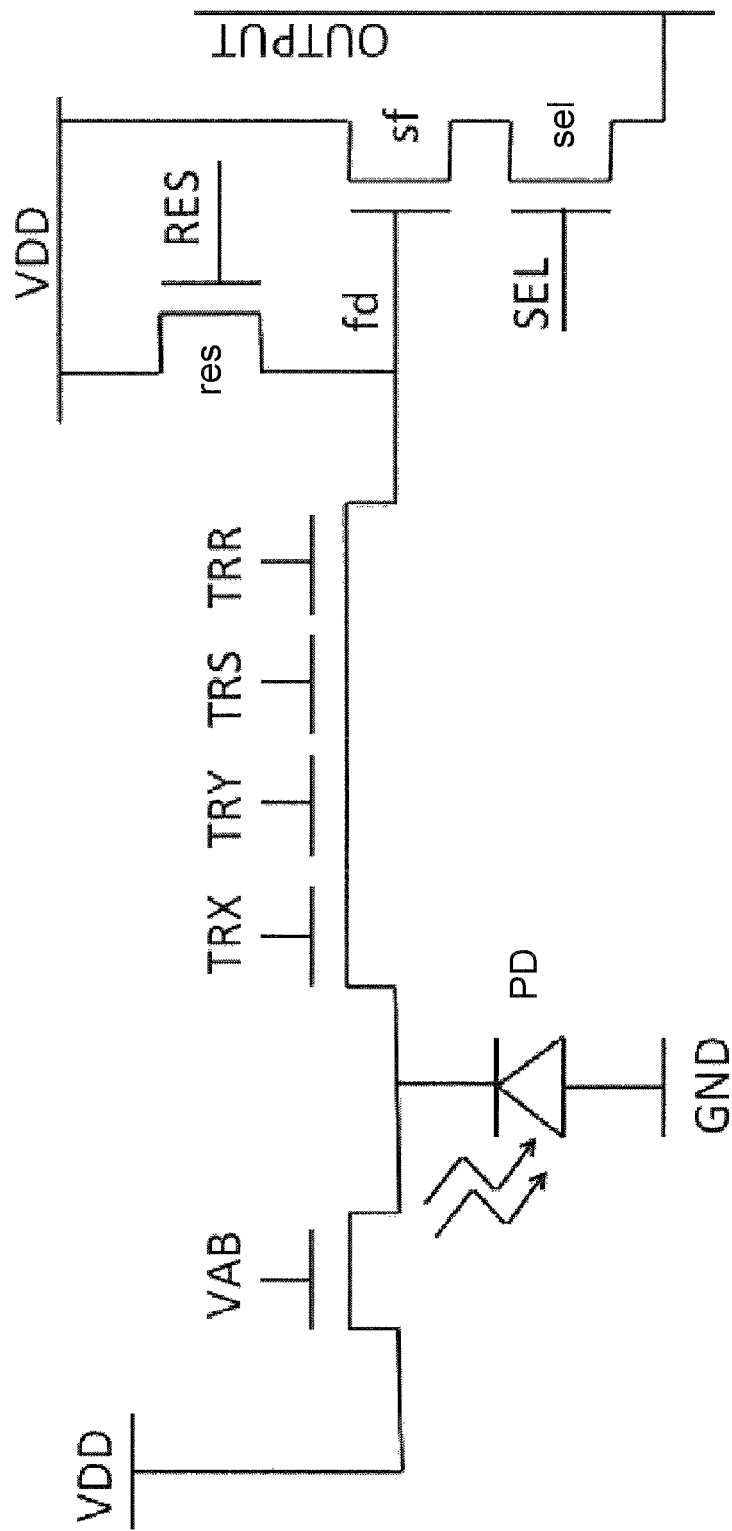
FIGS. 19 to 23 show pixel structures capable of global shutter operation.

FIG. 19 shows a pixel with four transfer gates: TRX, TRY, TRS, TRR, arranged in series between photodiode PD and charge sense node fd. A further gate VAB is connected between the photodiode PD and supply line VDD. Start of exposure is controlled by pulsing gate VAB. Alternatively, the start of the exposure is controlled by putting the four adjacent transfer gates high and keeping the charge conversion node (fd) in reset. At the end of the exposure period of a pixel at location (x,y) the horizontal and vertical transfer control lines controlling TRY and TRX respectively, are put high. TRS is also put high, at a higher voltage. Electrons accumulated at PD will transfer from the photodiode onto the TRS gate. During readout, the charge conversion node FD is reset and the reset level is sampled in the readout circuit. Then, TRR is pulsed to move the electrons to the charge conversion node fd, and the charge conversion node fd is sampled again. This pixel allows a combination of correlated double sampling (CDS) and individual pixel exposure control. Besides control over the start of exposure, VAB is also used as a horizontal anti-blooming drain to drain excess charges from the photodiode in case of overexposure. Advantageously, the low level of VAB should be chosen such that this gate acts as an effective anti-blooming drain. The low level of VAB will be higher than the low level of TRX or TRY.

Figure 20:
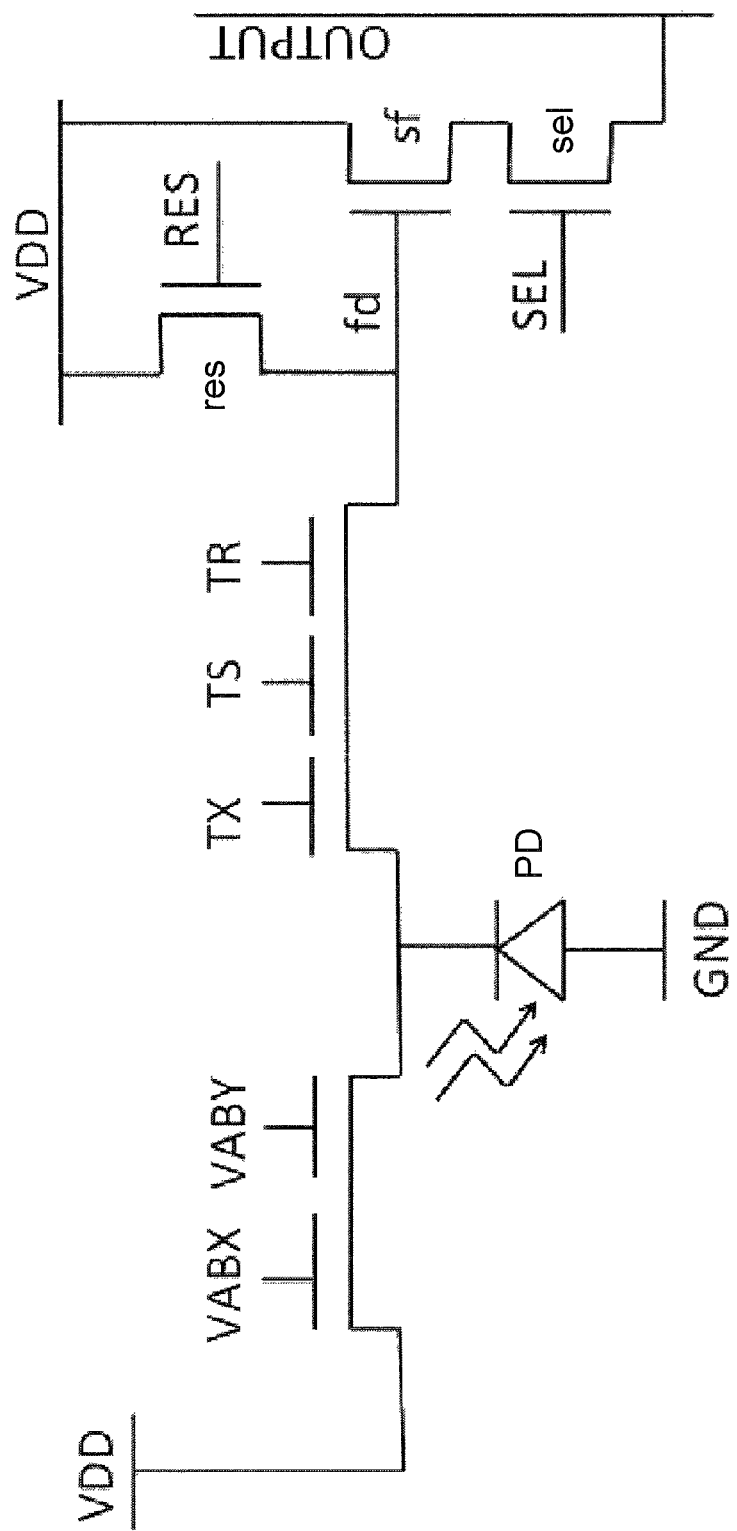

FIG. 20 shows an alternative implementation. It provides global shutter functionality with correlated double sampling. The pixel has three transfer gates: TX, TS, TR, arranged in series between photodiode PD and charge sense node fd. Gates VABX and VABY are connected in series between the photodiode PD and supply line VDD. To control the start of the exposure, the adjacent gates VABX and VABY are pulsed together. VABX is controlled by a vertical control line and VABY is controlled by a horizontal control line. Only when both lines are high, the photodiode is reset. The low level of VABX and VABY is chosen such that the two gates act as an anti-blooming drain.

Figure 21:
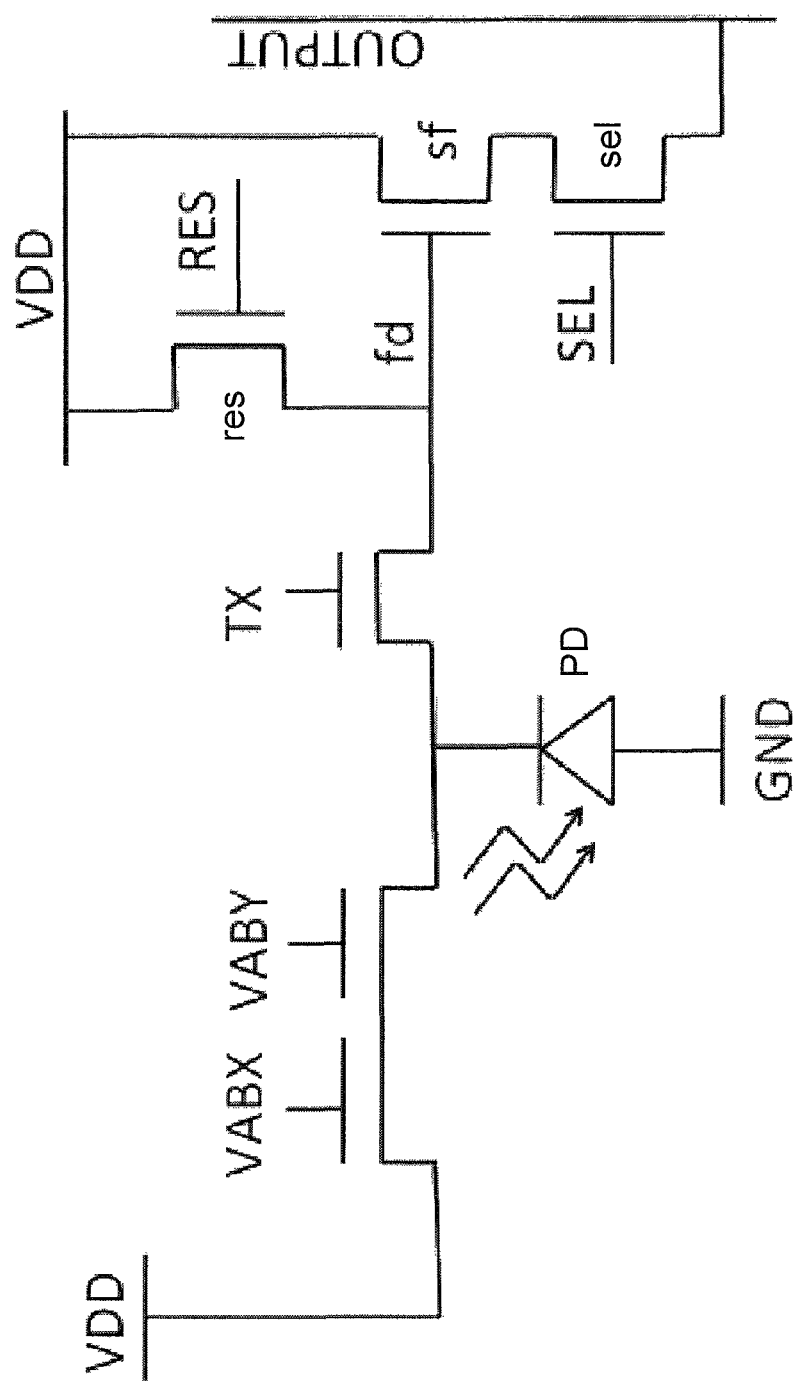

FIG. 21 shows an implementation of the same regional shutter control, using two adjacent transfer gates, but now as an addition to a 5-transistor global shutter pixel as described in U.S. Pat. No. 7,045,753. The two series-connected gates VABX, VABY are used in the same way as for FIG. 19.

Figure 22:
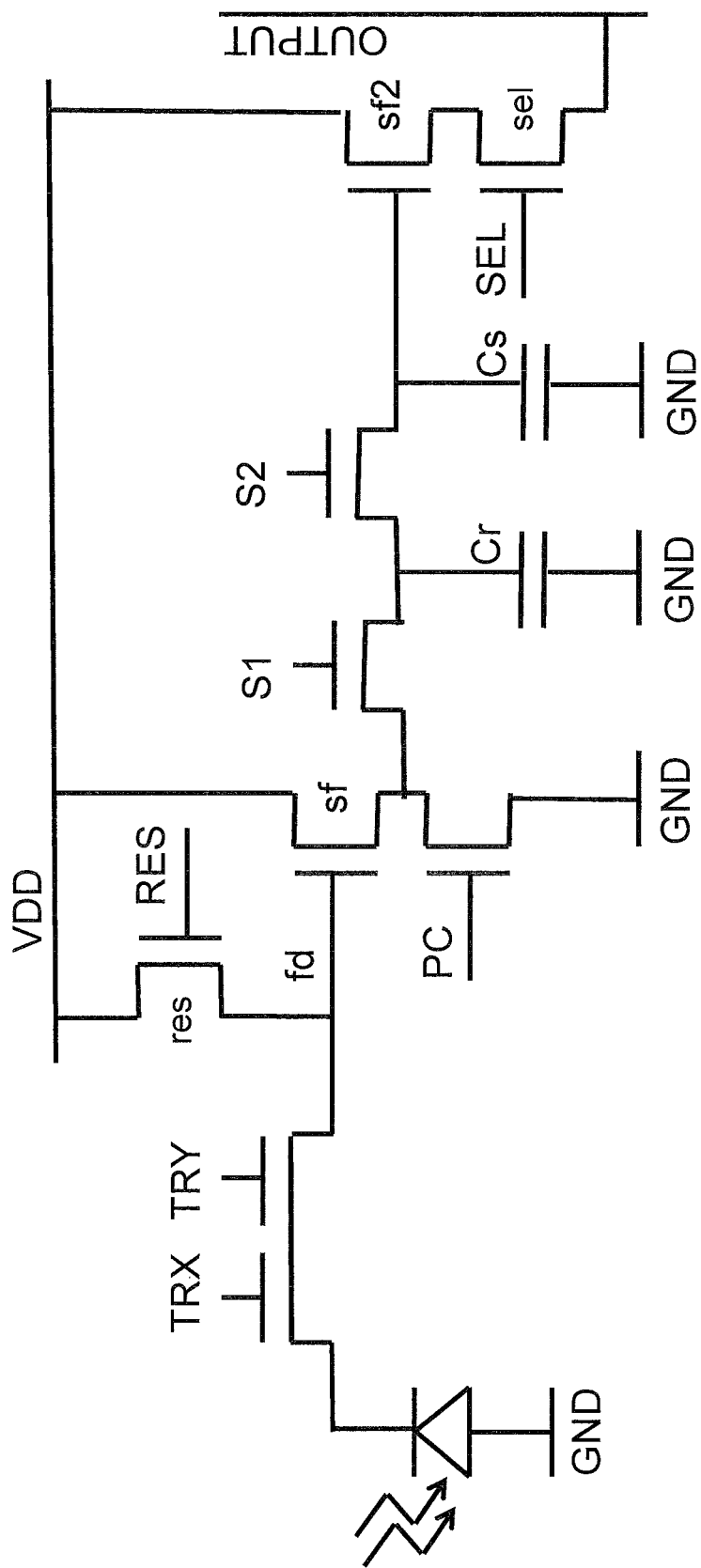
Figure 23:
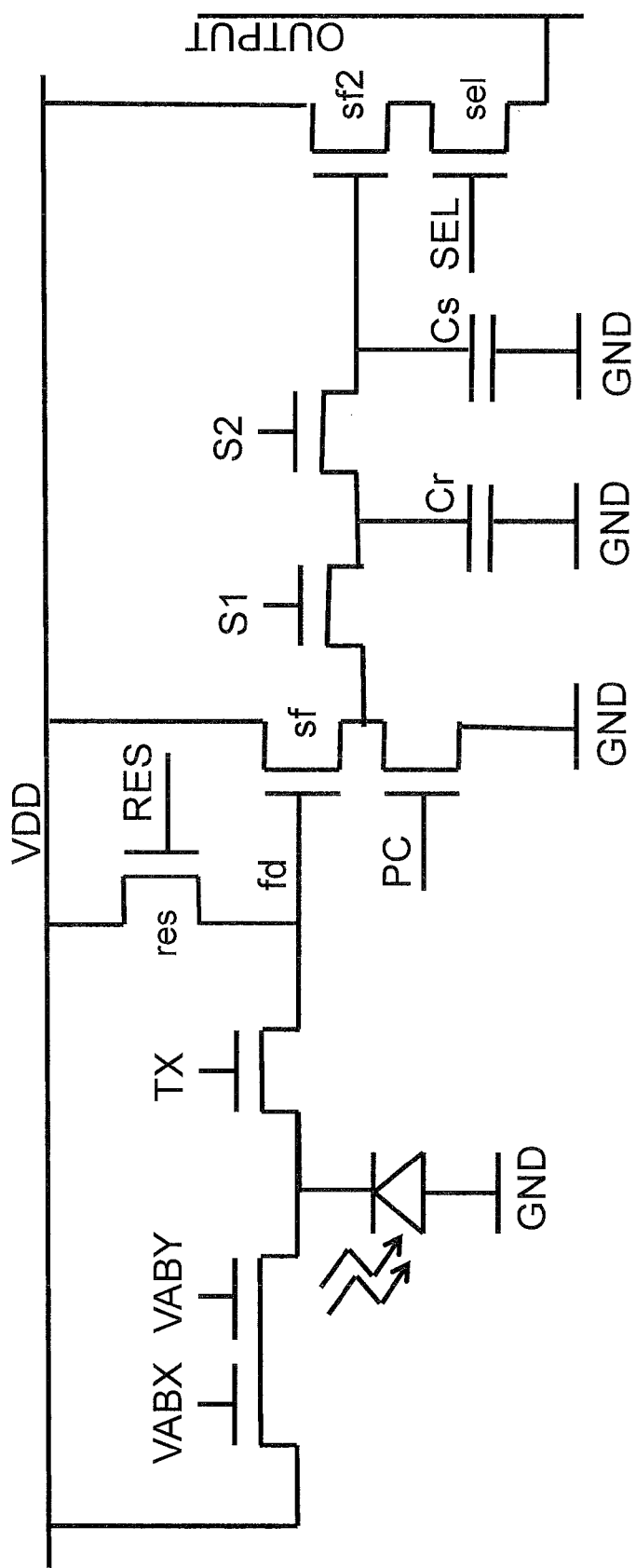

FIGS. 22 and 23 show other implementations of global shutter pixels which have been modified to incorporate two series-connected transfer gates. In FIG. 22 the additional gates are TRX, TRY. In FIG. 23 the additional gates are VABX, VABY. The pixels are described in detail in United States Patent Application US 2009/256060A1, the contents of which are incorporated herein by reference.

Figure 24:
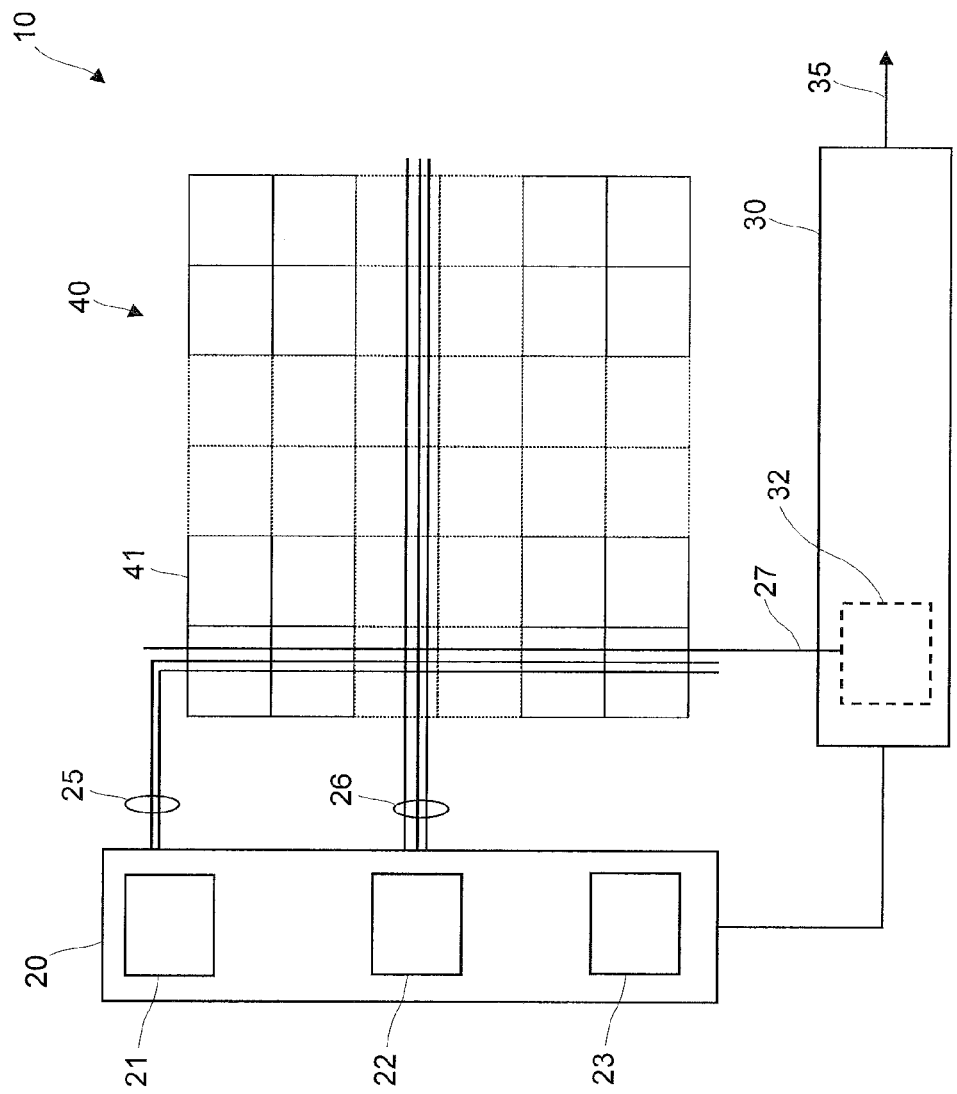
FIG. 24 shows a pixel array and controller.

FIG. 24 shows overall apparatus 10 for a pixel array 40. A pixel array 40 comprises a plurality of pixels 41 of any of the types described above. Controller 20 controls operation of the pixel array 40 and output circuitry 30. Controller 20 includes column selection/line driver circuitry 21 for generating control signals on control lines 25 which are aligned with columns of the array, and row selection/line driver circuitry 22 for generating control signals on control lines 26 which are aligned with rows of the array. The signals 25, 26 drive pixels 41 in the array 40. Controller 20 controls: resetting of the pixels to control the start of an exposure period (including operation of transfer gates TR1, TR2); operation of the transfer gates TR1, TR2 to transfer charges to the floating diffusions fd; operation of switches res, sel to control read-out from a pixel.

Example timing schemes for the control signals have been shown. The pixel array can be read out in a conventional manner, with pixels being scanned on a row-by-row basis. Alternatively, controller 20 can perform a global shutter function by synchronising operation of the control signals which control respective exposure times of each of the pixels of the array. Controller 20 also has control logic 23 to control operation of the output circuitry 30. The control logic of controller 20 can be stored in hard-coded form, such as in an Application Specific Integrated Circuit, or it can be stored in some form of reconfigurable processing apparatus, such as a logic array (programmable array, reconfigurable array) or a general-purpose processor which executes control software. All of the elements shown in FIG. 24 can be provided on a single semiconductor device or the elements can be distributed among several separate devices. Output circuitry 30 can comprise column processing circuitry 32 dedicated to each column, such as: an analog-to-digital converter (ADC), one or more amplifiers, storage to store values in order to perform features such as correlated double sampling (CDS). Output circuitry 30 outputs a signal 35.

Figure 25:
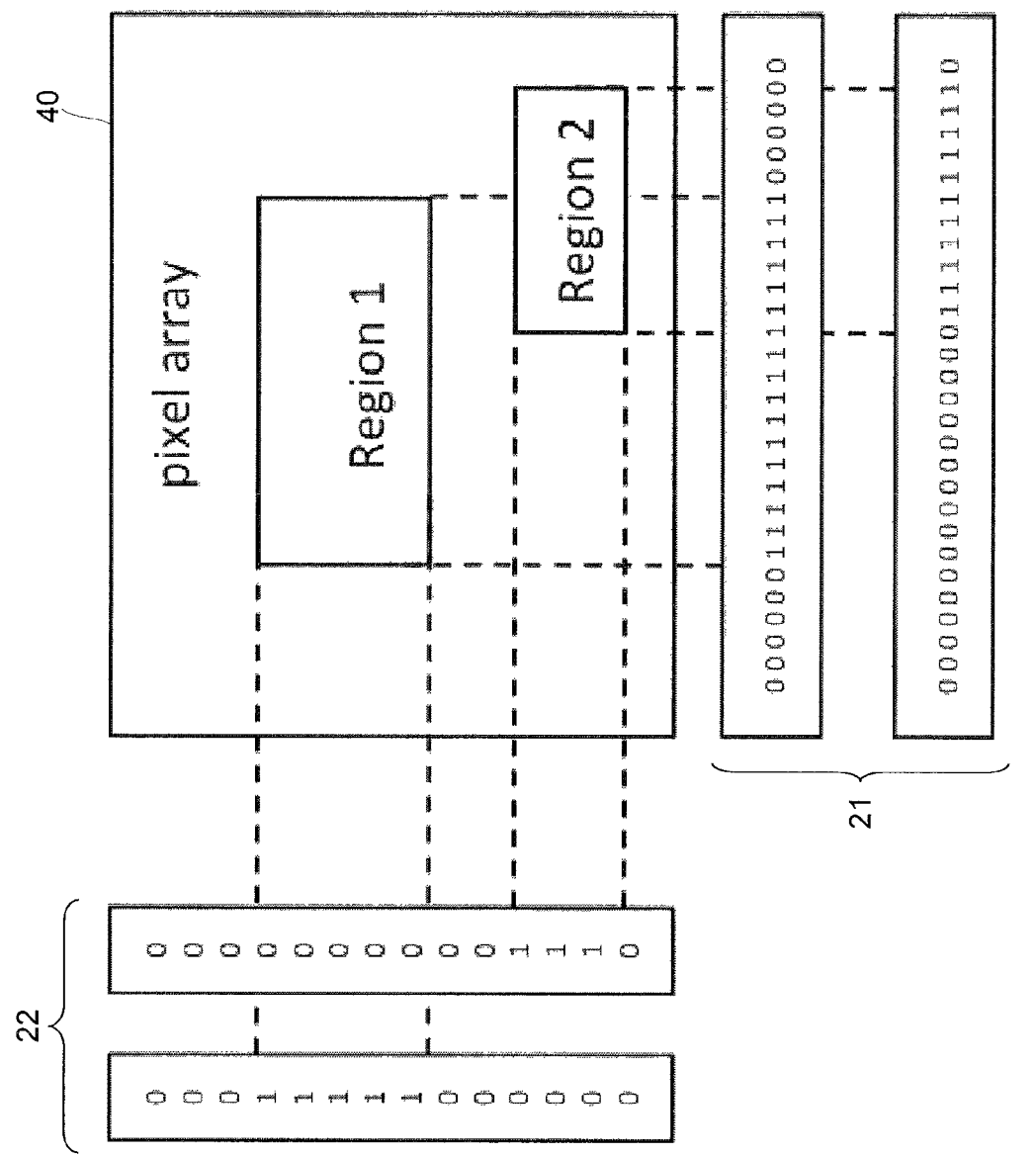
FIG. 25 shows exposure control of regions of interest of a pixel array.

FIG. 25 shows an implementation of the row and column logic 21, 22 to allow a regional shutter function. Several shift registers are implemented in the row logic (left/right of the pixel array) and the column logic (top/bottom side of the pixel array). The shift registers are uploaded with a pattern that identifies the rows and columns to reset prior to the exposure. In a global shutter operation, the pixels are reset by driving the TRY lines directly by the content of one of the shift registers in the row logic, and the TRX lines directly by the content of one of the shift registers in the column logic. At different moments in time, regions of pixels are reset by driving the TRX and TRY lines via the according shift registers. For a rolling shutter operation, the row logic contains additional logic to gate the content of the shift registers with the reset pulse which is generated by one pulse only.

Figure 26:
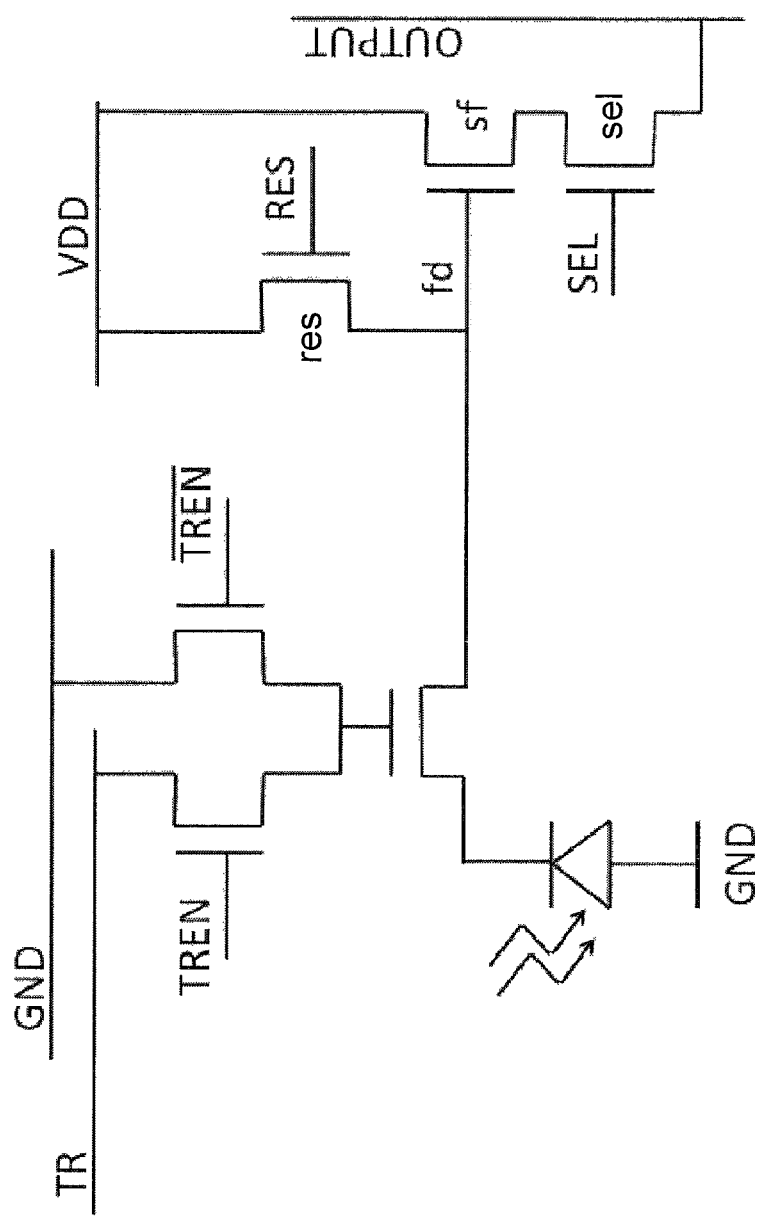
FIGS. 26 and 27 show another 4T pixel structure with exposure control provided by an additional switch connected between a transfer control line and the transfer gate.
Figure 27:
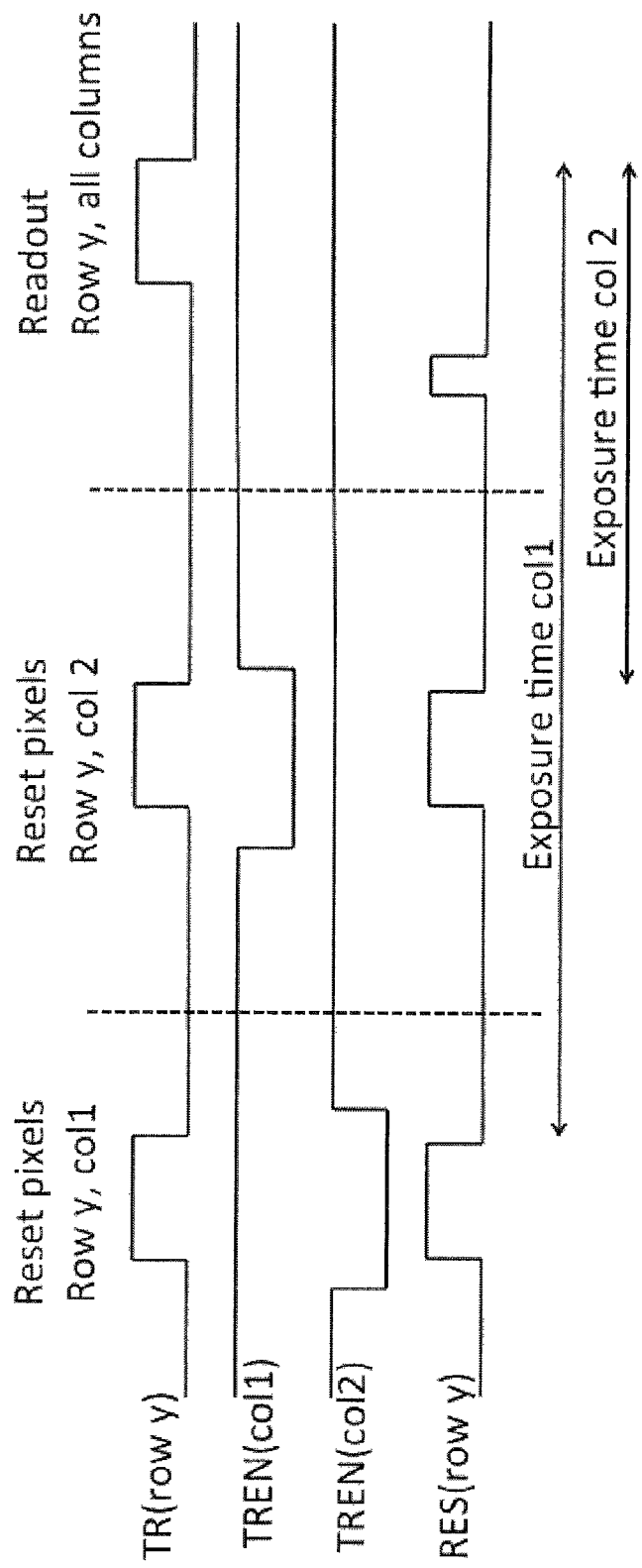

Another implementation of an exposure control for a 4T pixel will now be Described with reference to FIGS. 26 and 27. A switch is added between the transfer control line TR and the transfer gate. A switch between the transfer control line TR and the transfer gate is used to select the pixels that will be controlled by the transfer control line. In case a pixel does not need a charge transfer, the transfer pulse will be disabled by opening the switch between the transfer control line and the transfer gate. FIG. 27 shows the timing of this pixel. The transfer gate will remain floating during this time. Since the transfer gate is only switched on for a short time (less than 10 microseconds), it does not harm to keep the gate floating for a short time. If this is a concern, or if the transfer gate must be switched on for longer time, an additional switch can be foreseen that pulls the gate to a low voltage (e.g. GND). This is typically not required however.

This implementation has a drawback in that the transfer gate must be biased to a high voltage to guarantee a good charge transfer. The transfer gate high voltage must be at least as high as the sum of the photodiode pinning voltage and the threshold voltage of the transfer gate. In the pixel, only NMOS transistors can be used. The switch between the transfer control line and the transfer gate is an NMOS transistor. The gate of this transistor must be driven to a voltage which is sufficiently higher than the transfer gate high voltage and the threshold voltage of the NMOS transistor, to allow to put the high voltage of the transfer line on the transfer gate. Since practically, the max. voltage that can be put on the switch transistor is limited, the highest voltage that can be applied to the transfer gate is reduced. The embodiments described in this specification circumvent this limitation.

The invention is not limited to the embodiments described herein, which may be modified or varied without departing from the scope of the invention.

The invention claimed is:
1. A pixel array comprising:
a plurality of pixel structures, each pixel structure comprising:
  a photo-sensitive element that generates charge in response to incident light;
  a charge conversion element;
  a first transfer gate and a second transfer gate connected in series between the photosensitive element and the charge conversion element or between the photosensitive element and a supply line;
  an output stage;

a first transfer gate control line connected to the first transfer gates of a first sub-set of the pixel structures in the array;
a second transfer gate control line connected to the second transfer gates of a second sub-set of the pixel structures in the array,
wherein the first sub-set of pixel structures and second sub-set of pixel structures partially overlap, having at least one pixel structure in common between them,
wherein the second transfer gate is connected adjacent to the charge conversion element and is configured to be operated so as to adjust a capacitance of the charge conversion element between a high capacitance mode and a low capacitance mode when the second transfer gate is switched on or off, respectively, and
wherein each pixel structure comprises a reset stage for resetting the photo-sensitive element, the reset stage comprising a first reset gate and a second reset gate, connected in series, between the photo-sensitive element and a reset supply line, the pixel array further comprising control logic which is arranged to control a start of an exposure period for the pixel by switching on the first reset gate and the second reset gate at the same time as operating the reset stage.

2. The pixel array according to claim 1, wherein a voltage on the second transfer gate is higher than a voltage on the first transfer gate.

3. The pixel array according to claim 1, wherein the pixel array further comprises control logic arranged to control read-out of the pixel structure in a low gain mode where charges transferred from the photo-sensitive element are stored on a combination of the second transfer gate and the charge conversion element.

4. The pixel array according to claim 1, wherein the first sub-set of pixel structures and the second sub-set of pixel structures have only one pixel structure in common between them.

5. The pixel array according to claim 1, wherein the first sub-set of pixel structures and the second sub-set of pixel structures are arranged perpendicularly in the array.

6. The pixel array according to claim 1, wherein there is a plurality of first transfer gate control lines, each connected to a respective first sub-set of pixel structures and a plurality of second transfer gate control lines, each connected to a respective second sub-set of pixel structures.

7. The pixel array according to claim 1, wherein the output stage of each pixel structure comprises a select switch and wherein one of the transfer gate control lines is connected to the select switches in the same sub-set of pixel structures as the transfer gate control line.

8. The pixel array according to claim 1, further comprising control logic which is arranged to control read-out of one of the pixel structures in a high gain mode where charges transferred from the photo-sensitive element are only stored on the charge conversion element.

9. The pixel array according to claim 1, wherein the second transfer gate is connected to the charge conversion element, and wherein the second transfer gate has a higher potential level than the first transfer gate when the transfer gates are operated.

10. The pixel array according to claim 1, wherein each pixel structure comprises a reset stage for resetting the charge conversion node and the pixel array further comprises control logic which is arranged to control a start of an exposure period for the pixel by switching on the first transfer gate and the second transfer gate at the same time as operating the reset stage.

11. The pixel array according to claim 1, wherein a reset control line connects to a reset stage in one of the first sub-set of pixel structures and the second sub-set of pixel structures.

12. The pixel array according to claim 1, further comprising control logic which is arranged to control an end of an exposure period of one of the pixel structures by operating the first transfer gate control line and the second transfer gate control line to transfer charges from the photosensitive element to the charge conversion element.

13. The pixel array according to claim 1, wherein the first transfer gate and the second transfer gate are connected in series between the photosensitive element and the supply line, each pixel structure having at least one additional transfer gate connected between the photosensitive element and the charge conversion element.

14. The pixel array according to claim 1, further comprising control logic which is arranged to operate the first transfer gate control line and the second transfer gate control line.

15. The pixel array according to claim 4, wherein the first sub-set of pixel structures is one of a row and a column of the array and the second sub-set of pixel structures is the other of a row and a column of the array.

16. A pixel array comprising:
a plurality of pixel structures, each pixel structure comprising a photo-sensitive element that generates charge in response to incident light, a charge conversion element, a first transfer gate and a second transfer gate connected in series between the photosensitive element and the charge conversion element or between the photosensitive element and a supply line, wherein the supply line supplies signals to an output stage, wherein the second transfer gate is connected to the charge conversion element, the array comprising:
a first control logic operating first gates of a first sub-set of the pixel structures in the array; and
a second control logic operating second gates of a second sub-set of the pixel structures in the array for a period which at least partially overlaps operation of the first transfer gate control line,
wherein the first sub-set of pixel structures and second sub-set of pixel structures partially overlap, having at least one pixel structure in common between them,
wherein the second transfer gate is configured to be operated so as to adjust a capacitance of the charge conversion element between a high capacitance mode and a low capacitance mode when the second transfer gate is switched on or off, respectively, and
wherein each pixel structure comprises a reset stage for resetting the photo-sensitive element, the reset stage comprising a first reset gate and a second reset gate, connected in series, between the photo-sensitive element and a reset supply line, the pixel array further comprising a fourth control logic which is arranged to control a start of an exposure period for the pixel by switching on the first reset gate and the second reset gate at the same time as operating the reset stage.

17. A method of controlling an exposure period of a first pixel structure in an array of pixel structures, each pixel structure comprising a photo-sensitive element that generates charge in response to incident light, a charge conversion element, a first transfer gate and a second transfer gate connected in series between the photosensitive element and the charge conversion element or between the photosensitive element and a supply line and an output stage, the second transfer gate being connected to the charge conversion element, wherein each pixel structure comprises a reset stage for resetting the photo-sensitive element, the reset stage comprising a first reset gate and a second reset gate, connected in series, between the photo-sensitive element and a reset supply line, the pixel array further comprising a first control logic which is arranged to control a start of an exposure period for the pixel by switching on the first reset gate and the second reset gate at the same time as operating the reset stage, the method comprising:

operating the first control logic to control a start of an exposure period for the first pixel structure by switching on the first reset gate and the second reset gate at the same time as operating the reset stage;

operating a first transfer gate control line connected to the first transfer gate of a first sub-set of the pixel structures in the array;

operating a second transfer gate control line connected to the second transfer gate of a second sub-set of the pixel structures in the array for a period which at least partially overlaps operation of the first transfer gate control line;

operating the second transfer gate so as to adjust a capacitance of the charge conversion element between a high capacitance mode and a low capacitance mode when the second transfer gate is switched on or off, respectively, wherein the first sub-set of pixel structures and second sub-set of pixel structures partially overlap, having at least the first pixel structure in common between them.

18. The method according to claim 17, wherein the steps of operating the first transfer gate control line and operating the second transfer gate control line define a start of an exposure period of the first pixel structure, and wherein a second pixel structure in the array has a different exposure period.

* * * * *